US012727325B2

(12) United States Patent
Kang et al.

(10) Patent No.: US 12,727,325 B2
(45) Date of Patent: Sep. 1, 2026

(54) DISPLAY PANEL

(71) Applicant: Samsung Display Co., Ltd., Yongin-si (KR)

(72) Inventors: Sunmi Kang, Cheonan-si (KR); Joohee Jeon, Hwaseong-si (KR); Juhoon Kang, Hwaseong-si (KR); Gun Hee Kim, Seoul (KR); Hyungkeun Park, Seoul (KR); Seokhyun Lim, Hwaseong-si (KR); Sunyoung Jung, Suwon-si (KR); Miyeon Cho, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 726 days.

(21) Appl. No.: 17/944,675

(22) Filed: Sep. 14, 2022

(65) Prior Publication Data

US 2023/0165056 A1 May 25, 2023

(30) Foreign Application Priority Data

Nov. 22, 2021 (KR) ........................ 10-2021-0161695

(51) Int. Cl.
*H10K 59/121* (2023.01)
*H10D 30/67* (2025.01)
*H10K 59/131* (2023.01)

(52) U.S. Cl.
CPC ..... *H10K 59/1213* (2023.02); *H10D 30/6743* (2025.01); *H10D 30/6755* (2025.01); *H10K 59/131* (2023.02)

(58) Field of Classification Search
CPC ............. H10K 59/1213; H10K 59/131; H10D 30/6743; H10D 30/6755; H10D 86/423; H10D 86/471; H10D 86/481
See application file for complete search history.

(56) References Cited

U.S. PATENT DOCUMENTS 11,056,509 B2 7/2021 Je et al.
2015/0055051 A1 2/2015 Osawa et al.
(Continued)

FOREIGN PATENT DOCUMENTS

KR 10-0543009 1/2006
KR 10-2016-0027903 3/2016
(Continued)

*Primary Examiner* — Jacob Y Cho

(74) *Attorney, Agent, or Firm* — Harness, Dickey & Pierce, P.L.C.

(57) ABSTRACT

A display panel includes a first transistor including a first semiconductor pattern including one of a silicon semiconductor and an oxide semiconductor and a first gate electrode overlapping the first semiconductor pattern in a plan view, a second transistor including a second semiconductor pattern different from the first semiconductor pattern and a second gate electrode overlapping the second semiconductor pattern in the plan view, a first upper electrode overlapping the first gate electrode in the plan view, a first connection electrode electrically connected to the first semiconductor pattern via a first contact hole through at least one insulating layer, and a light emitting element disposed on the first connection electrode. A single insulating layer is disposed between the light emitting element and the first connection electrode, and the first connection electrode is electrically connected to the light emitting element via a second contact hole through the single insulating layer.

19 Claims, 36 Drawing Sheets

(56) References Cited

U.S. PATENT DOCUMENTS

2020/0243635 A1* 7/2020 Lee ...................... H10K 59/126
2021/0013280 A1* 1/2021 Choi .................... H10K 59/123
2021/0036087 A1* 2/2021 Kwak .................. G09G 3/3233
2021/0057506 A1* 2/2021 Jo ...................... H10K 59/1216
2021/0351384 A1* 11/2021 Lee ...................... H10D 86/451

FOREIGN PATENT DOCUMENTS

KR 10-2016-0075461 6/2016
KR 10-2020-0060071 5/2020

* cited by examiner

FIG. 3A

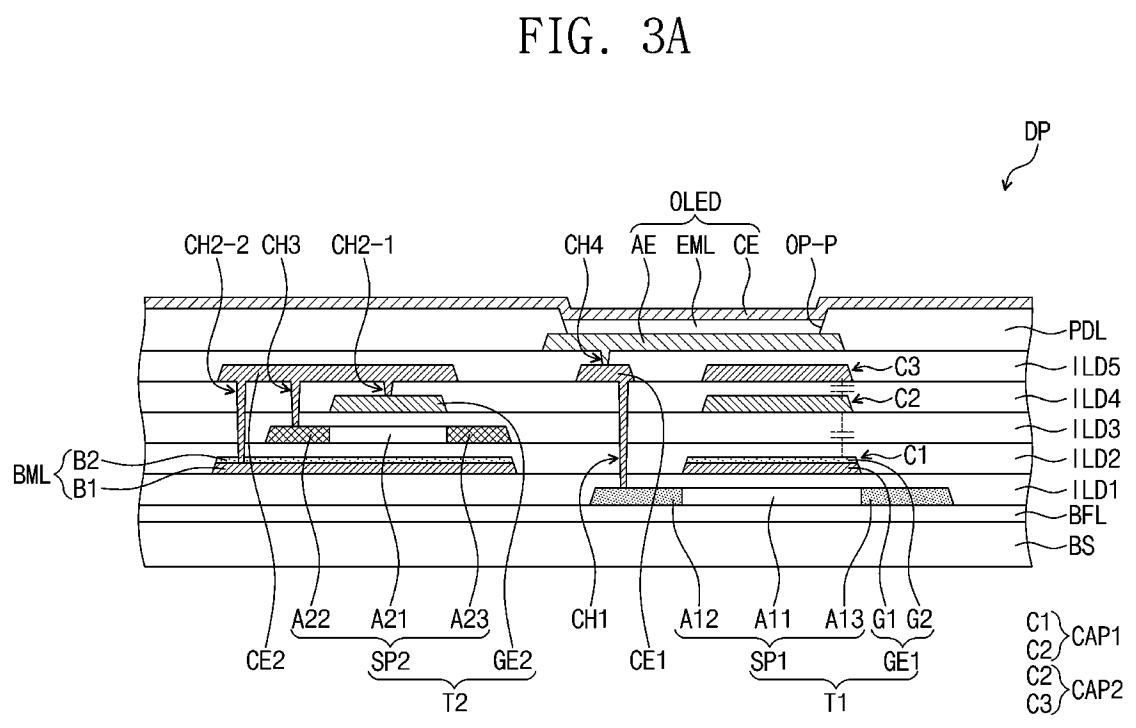

DP
PDL
ILD5
ILD4
ILD3
ILD2
ILD1
BFL
BS
C1 C2 CAP1
C2 C3 CAP2
OLED
AE EML CE
OP-P
C3 C2 C1
G1 G2 GE1
A13 A11 A12
SP1
T1
CE1
CH4
CH1
GE2
A23 A21 A22
SP2
T2
CH2-1
CH3
CH2-2
CE2
BML B2 B1

MSK6a
PR6a
ILD4
ILD3
ILD2
ILD1
BFL
BS
C1
C2
CAP1
G1 G2
GE1
A13
A11
A12
SP1
T1
CH1
GE2
A23
A21
A22
SP2
T2
CH2-1
OP-M6
CH2-2
BML
B2
B1

Figure 5P:
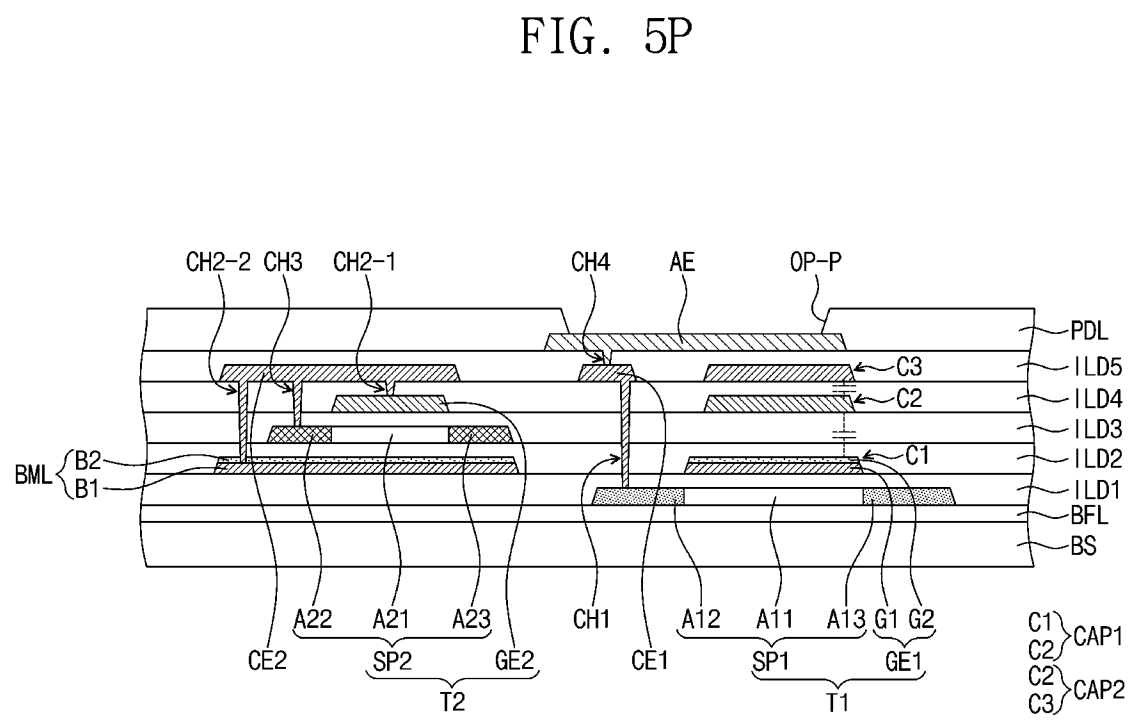

PDL
ILD5
ILD4
ILD3
ILD2
ILD1
BFL
BS
C1 C2 CAP1
C2 C3 CAP2
OP-P
AE
CH4
CH2-1
CH3
CH2-2
C3
C2
C1
G1 G2 GE1
A13
A11
A12
SP1
T1
CE1
CH1
GE2
A23
A21
A22
SP2
T2
CE2
BML B2 B1

MSK5b
PR5b
P-CE
ILD3
ILD2
BFL
BS
OP-M5
OP-M5
OP-M5
CH2
G2
G1
GE1
A13
A11
A12
SP1
T1
CH1
G2
G1
GE2
A23
A21
A22
SP2
T2

DISPLAY PANEL

CROSS-REFERENCE TO RELATED APPLICATION(S)

This application claims priority to and benefits of Korean Patent Application No. 10-2021-0161695 under 35 U.S.C. § 119, filed on Nov. 22, 2021 in the Korean Intellectual Property Office, the entire contents of which are incorporated herein by reference.

BACKGROUND

1. Technical Field

The disclosure relates to a display panel including pixels.

2. Description of the Related Art

A display panel may include to display images. Each pixel may include a pixel driving circuit and a display element connected to the pixel driving circuit. The pixel driving circuit may include at least one thin film transistor and a capacitor. The thin film transistor and the capacitor of the pixel driving circuit control the display element in response to an electrical signal applied thereto from a driving circuit.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display panel manufactured with a simplified process and having improved electrical characteristics and display characteristics.

Embodiments provide a display panel that may include a first transistor including a first semiconductor pattern including one of a silicon semiconductor and an oxide semiconductor and a first gate electrode overlapping the first semiconductor pattern in a plan view; a second transistor including a second semiconductor pattern different from the first semiconductor pattern and a second gate electrode overlapping the second semiconductor pattern in the plan view; a first upper electrode overlapping the first gate electrode in the plan view; a first connection electrode electrically connected to the first semiconductor pattern via a first contact hole through at least one insulating layer; and a light emitting element disposed on the first connection electrode. A single insulating layer may be disposed between the light emitting element and the first connection electrode, and the first connection electrode is electrically connected to the light emitting element via a second contact hole through the single insulating layer.

The first gate electrode may include layers, and an uppermost layer among the layers may include titanium nitride ($TiN_x$).

The at least one insulating layer may include a first insulating layer disposed between the first semiconductor pattern and the first gate electrode; and a second insulating layer disposed on the first gate electrode.

The first insulating layer may be disposed between the second semiconductor pattern and the second gate electrode.

The at least one insulating layer may include a third insulating layer disposed on the second insulating layer, the second insulating layer may be disposed below the second semiconductor pattern, and the third insulating layer may be disposed between the second semiconductor pattern and the second gate electrode.

The second gate electrode and the first gate electrode may be disposed on a same layer.

The second gate electrode may be disposed above the first gate electrode.

The first upper electrode and the first connection electrode may be disposed on a same layer.

The first upper electrode and the second gate electrode may be disposed on a same layer.

The first upper electrode and the second semiconductor pattern may be disposed on a same layer.

The display panel may further include a second upper electrode overlapping the first upper electrode in the plan view. The first upper electrode may be disposed between the first gate electrode and the second upper electrode, and the second upper electrode and the first connection electrode may be disposed on a same layer.

The display panel may further include a second connection electrode electrically connected to the second semiconductor pattern through the at least one insulating layer, and the second connection electrode and the first connection electrode may be disposed on a same layer.

The display panel may further include a second connection electrode electrically connected to the second semiconductor pattern through the at least one insulating layer, and the second connection electrode and the light emitting element may be disposed on a same layer.

The display panel may further include a blocking layer disposed on a same layer as the first gate electrode, and the blocking layer may overlap the second semiconductor pattern in the plan view.

The second semiconductor pattern may be disposed between the blocking layer and the second gate electrode, and the blocking layer may be electrically connected to the second gate electrode.

The display panel may further include a first signal line disposed on a same layer as the first gate electrode, the first signal line and the first gate electrode including a same material and a second signal line and the first connection electrode disposed on a same layer, the second signal line and the first connection electrode including a same material.

Embodiments provide a display panel that may include a first transistor including a silicon semiconductor pattern and a first gate electrode overlapping the silicon semiconductor pattern in a plan view; a second transistor including an oxide semiconductor pattern and a second gate electrode overlapping the oxide semiconductor pattern in the plan view; a first capacitor including a first electrode integral with the first gate electrode and a second electrode overlapping the first electrode in the plan view; a first connection electrode electrically connected to the silicon semiconductor pattern; a second connection electrode electrically connected to the oxide semiconductor pattern via a first contact hole through a first insulating layer, a second insulating layer, and a third insulating layer; the first insulating layer disposed between the oxide semiconductor pattern and the second gate electrode; the second insulating layer disposed between the first electrode and the second electrode; the third insulating layer disposed on the first connection electrode; and a light emitting element including a pixel electrode electrically connected to the first connection electrode via a first contact hole through the third insulating layer. The second connection electrode and the pixel electrode may be disposed on a same layer.

Embodiments provide a display panel that may include a first transistor including a silicon semiconductor pattern and a first gate electrode overlapping the silicon semiconductor pattern in a plan view; a second transistor including an oxide semiconductor pattern and a second gate electrode overlapping the oxide semiconductor pattern in the plan view; a connection electrode electrically connected to the silicon semiconductor pattern; a first upper electrode forming a capacitor with the first gate electrode; a second upper electrode forming a capacitor with the first upper electrode; a first insulating layer disposed between the silicon semiconductor pattern and the first gate electrode; a second insulating layer disposed between the first gate electrode and the first upper electrode; a third insulating layer disposed between the oxide semiconductor pattern and the second upper electrode; and a fourth insulating layer disposed between the first upper electrode and the second upper electrode. The connection electrode and the second upper electrode may be disposed on a same layer.

The first upper electrode and the second gate electrode may be disposed on a same layer, and the third insulating layer may overlap the first upper electrode in the plan view.

The first upper electrode and the oxide semiconductor pattern may be disposed on a same layer, and the third insulating layer may not overlap the first upper electrode in the plan view.

According to the above, the number of masks required to form the transistors including different semiconductor patterns and the capacitor is reduced. Thus, a manufacturing process of the display panel is simplified, and a manufacturing cost of the display panel is reduced.

While the display panel is manufactured with the simplified process, a capacitance of the capacitor increases, a response speed of the pixel is improved, and electrical characteristics and display characteristics of the display panel are improved.

BRIEF DESCRIPTION OF THE DRAWINGS

The above and other advantages of the disclosure will become readily apparent by reference to the following detailed description when considered in conjunction with the accompanying drawings wherein:

FIGS. 3A and 3B are schematic cross-sectional views of display panels according to embodiments;

FIGS. 4A and 4B are schematic cross-sectional views of display panels according to embodiments;

FIGS. 6A to 6M are schematic cross-sectional views of a method of manufacturing a display panel according to an embodiment.

DETAILED DESCRIPTION OF THE EMBODIMENTS

Figure 1:
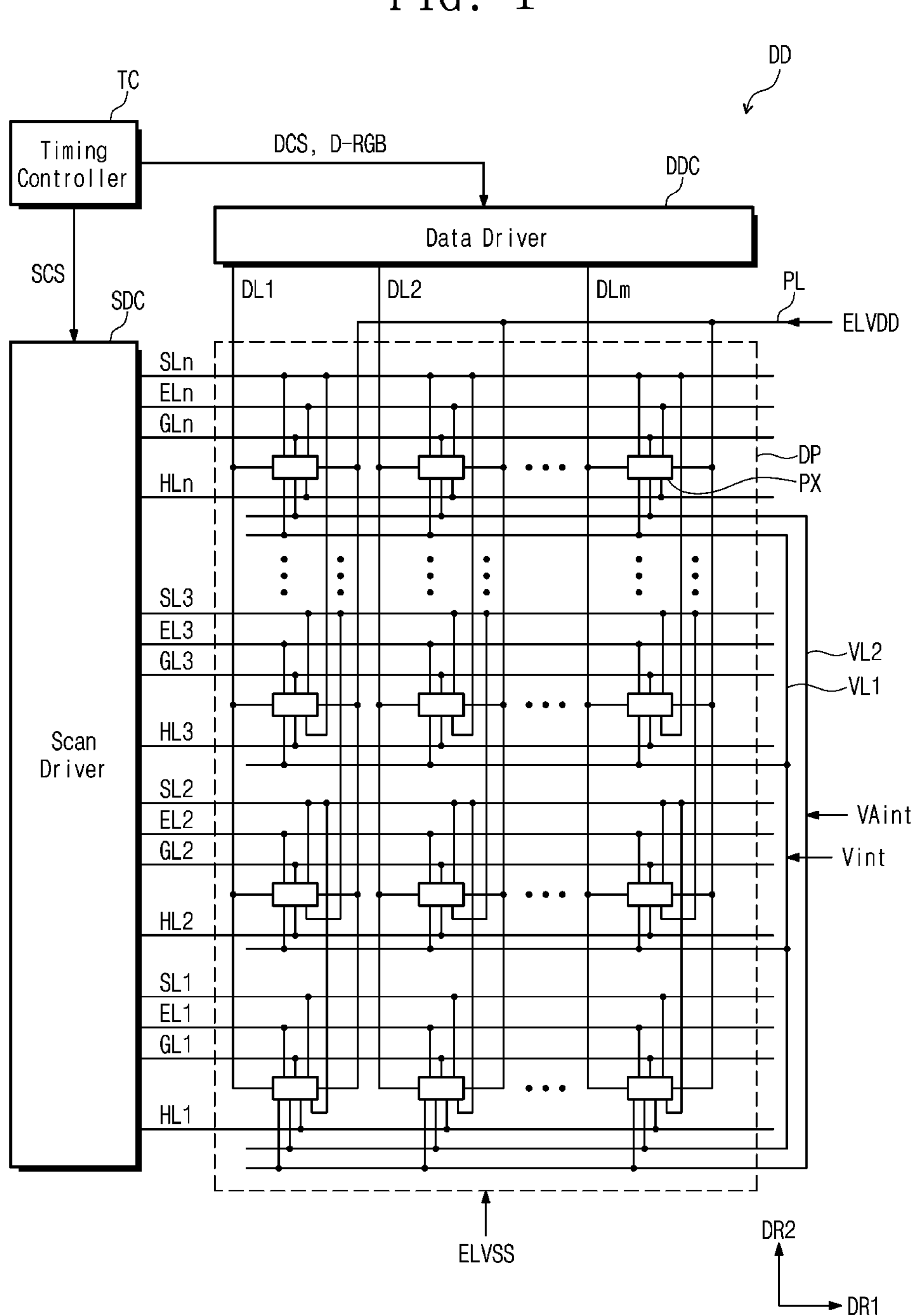
FIG. 1 is a block diagram of a display device according to an embodiment.

The disclosure may be variously modified and realized in many different forms, and thus embodiments will be illustrated in the drawings and described in detail hereinbelow. However, the disclosure should not be limited to the disclosed forms, and should be construed to include all modifications, equivalents, or replacements included in the spirit and scope of the disclosure.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Unless otherwise indicated or implied, it will be understood that the terms "connected to" or "coupled to" may include a physical or electrical connection or coupling.

Like numerals refer to like elements throughout. In the drawings, the thickness, ratio, and dimension of components are exaggerated for effective description of the technical content.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure.

As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures but is not limited thereto. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to accompanying drawings.

FIG. 1 is a block diagram of a display device DD according to an embodiment. The display device DD may be a device that is activated in response to electrical signals to display an image. For example, the display device DD may be applied to a large-sized electronic item, such as a television set or an outdoor billboard, and a small and medium-sized electronic item, such as a monitor, a mobile phone, a tablet computer, a navigation unit, or a game console. However, these are examples, and the display device DD may be applied to other electronic items within the spirit and the scope of the disclosure.

The display device DD may include a timing controller TC, a scan driver SDC, a data driver DDC, and a display panel DP. At least one of the timing controller TC, the scan driver SDC, and the data driver DDC may be provided in the form of a driving chip or may be directly formed in the display panel DP.

The timing controller TC may receive input image signals, may convert a data format of the input image signals to a data format appropriate to an interface between the timing controller TC and the scan driver SDC, and may generate image data D-RGB. The timing controller TC may output the image data D-RGB and various control signals DCS and SCS.

The scan driver SDC may receive a scan control signal SCS from the timing controller TC. The scan control signal SCS may include a vertical start signal to start an operation of the scan driver SDC and a clock signal to determine an output timing of signals.

The scan driver SDC may generate scan signals and may sequentially output the scan signals to corresponding signal lines SL1 to SLn, GL1 to GLn, and HL1 to HLn. The scan driver SDC may generate light emitting control signals in response to the scan control signal SCS and may output the light emitting control signals to corresponding light emitting lines EL1 to ELn.

In FIG. 1, the scan signals and the light emitting control signals are output from one scan driver SDC, but they should not be limited thereto or thereby. As an example, the scan driver circuit may be provided in plural, and the scan driver circuits may divide and output the scan signals, and may divide and output the light emitting control signals. According to an embodiment, a driving circuit generating and outputting the scan signals and a driving circuit generating and outputting the light emitting control signals may be separately implemented from each other.

The data driver DDC may receive a data control signal DCS and the image data D-RGB from the timing controller TC. The data driver DDC may convert the image data D-RGB to data signals and may output the data signals to data lines DL1 to DLm described later. The data signals may be analog voltages corresponding to grayscale values of the image data D-RGB.

The display panel DP may include groups of signal lines. In case that one of the groups of signal lines is defined as a first group signal line, another may be defined as a second group signal line, and the other may be defined as a third group signal line. Hereinafter, names of the signal lines are defined to distinguish the groups of signal lines from each other.

The groups of signal lines may include a first group of scan lines SL1 to SLn, a second group of scan lines GL1 to GLn, a third group of scan lines HL1 to HLn, the light emitting lines EL1 to ELn, the data lines DL1 to DLm, a first voltage line PL, a second voltage line VL1, and a third voltage line VL2. The first group of scan lines SL1 to SLn, the second group of scan lines GL1 to GLn, the third group of scan lines HL1 to HLn, and the light emitting lines EL1 to ELn may extend in a first direction DR1 and may be arranged (or disposed) in a second direction DR2 intersecting the first direction DR1. The data lines DL1 to DLm may be insulated from the first group of scan lines SL1 to SLn, the second group of scan lines GL1 to GLn, the third group of scan lines HL1 to HLn, and the light emitting lines EL1 to ELn while intersecting the first group of scan lines SL1 to SLn, the second group of scan lines GL1 to GLn, the third group of scan lines HL1 to HLn, and the light emitting lines EL1 to ELn.

Each of the first voltage line PL, the second voltage line VL1, and the third voltage line VL2 may include at least one of a line extending in the first direction DR1 and a line extending in the second direction DR2. The structure and shape of the first voltage line PL, the second voltage line VL1, and the third voltage line VL2 may be designed independently from each other.

Each of the pixels PX may be electrically connected to corresponding signal lines among the above-mentioned signal lines. Each of the pixels PX may be connected to a corresponding scan lines among the first, second, and third group of scan lines SL1 to SLn, GL1 to GLn, and HL1 to HLn, a corresponding light emitting line among the light emitting lines EL1 to ELn, and a corresponding data line among the data lines DL1 to DLm. A connection relationship between the pixels PX and the signal lines may be changed depending on a configuration of the driving circuit of the pixels PX.

The pixels PX may be connected to the first voltage line PL and may receive a first power supply voltage ELVDD applied to the first voltage line PL. The pixels PX may receive a second power supply voltage ELVSS. The second power supply voltage ELVSS may have a level lower than that of the first power supply voltage ELVDD.

The pixels PX may be connected to the second voltage line VL1 and may receive a first initialization voltage Vint. The pixels PX may be connected to the third voltage line VL2 and may receive a second initialization voltage VAint. Each of the first initialization voltage Vint and the second initialization voltage VAint may have a level lower than that of the first power supply voltage ELVDD. The first initialization voltage Vint and the second initialization voltage VAint may be a bias voltage with a constant level. The first initialization voltage Vint and the second initialization voltage VAint may have different levels from each other. The second initialization voltage VAint may be lower than the first initialization voltage Vint.

The display panel DP may display images in response to electrical signals. Each of the pixels PX of the display panel DP may include an organic light emitting element and a pixel driving circuit controlling a light emission of the organic light emitting element. The pixel driving circuit may include thin film transistors and at least one capacitor. At least one of the scan driver SDC and the data driver DDC may include thin film transistors formed through a same process as the pixel driving circuit.

The pixels PX may receive data voltages in response to the scan signals. The pixels PX may emit lights with luminance corresponding to the data voltages in response to light emitting signals. A light emission time of each pixel PX may be controlled by the light emitting signals. Accordingly, the display panel DP may output the images through the pixels PX.

The pixels PX may include groups that generates lights having different colors from each other. As an example, the pixels PX may include red pixels generating a red light, green pixels generating a green light, and blue pixels generating a blue light. A light emitting element of the red pixels, a light emitting element of the green pixels, and a light emitting element of the blue pixels may include light emitting layers formed of different materials from each other, however, the disclosure should not be particularly limited.

In an embodiment, the first group of scan lines SL1 to SLn, the second group of scan lines GL1 to GLn, the third group of scan lines HL1 to HLn, the light emitting lines EL1 to ELn, the data lines DL1 to DLm, the first voltage line PL, the second voltage line VL1, the third voltage line VL2, the pixels PX, the scan driver SDC, and the data driver DDC may be formed on a single base substrate through photolithography processes, however, this is an example. According to an embodiment, the scan driver SDC or the data driver DDC may be electrically connected to the display panel DP through an attachment process after being mounted on a separate circuit substrate.

Figure 2A:
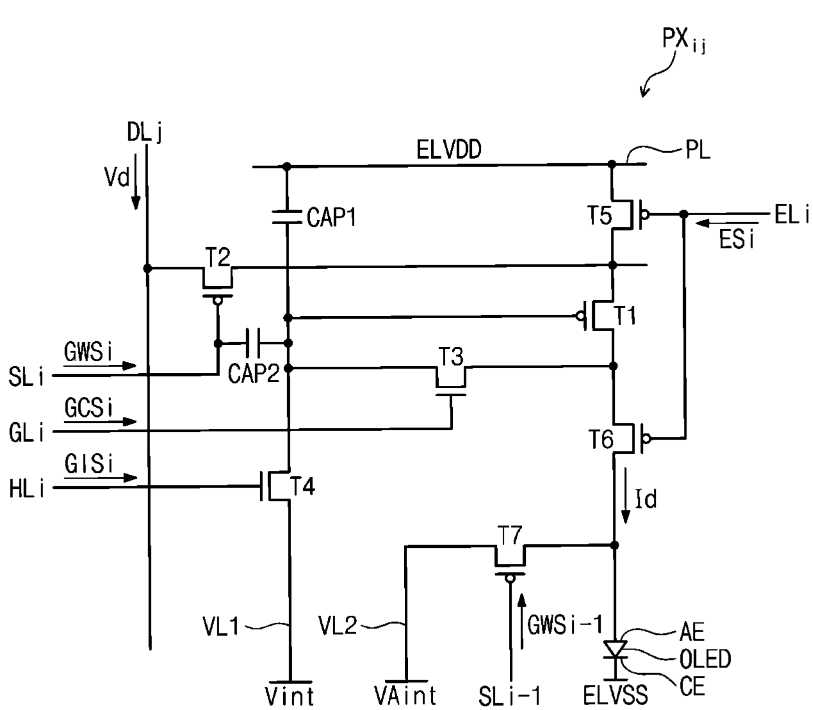
FIGS. 2A and 2B schematic diagrams of equivalent circuits of pixels according to embodiments.
Figure 2B:
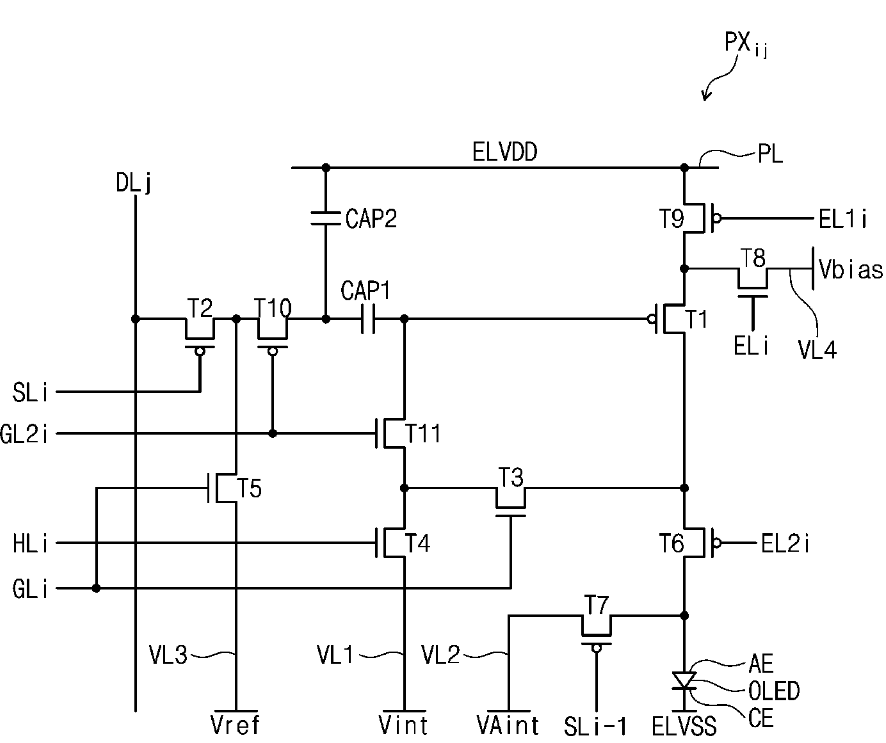

FIGS. 2A and 2B are schematic diagrams of equivalent circuits of pixels PXij according to embodiments. FIGS. 2A and 2B show the pixel PXij connected to an i-th scan line SLi among the first group of scan lines SL1 to SLn and connected to a j-th data line DLj among the data lines DL1 to DLm as a representative example. In an embodiment, i and j denote a natural number.

The pixel PXij may include a light emitting element OLED, transistors, and at least one capacitor. The transistors and the capacitor may control the amount of a current flowing through the light emitting element OLED. The light emitting element OLED may generate a light with a luminance according to the amount of the current supplied thereto. According to a configuration of the schematic diagram of the equivalent circuit of the pixel PXij, the number of the transistors and the number of the capacitors included in the pixel PXij may be changed.

Referring to FIG. 2A, the driving circuit of the pixel PXij may include the light emitting element OLED, first, second, third, fourth, fifth, sixth, and seventh transistors T1, T2, T3, T4, T5, T6, and T7, and first and second capacitors CAP1 and CAP2.

Each of the first transistor T1, the second transistor T2, the fifth transistor T5, the sixth transistor T6, and the seventh transistor T7 may be a P-type transistor, and each of the third transistor T3 and the fourth transistor T4 may be an N-type transistor. However, the first to seventh transistors T1 to T7 should not be limited thereto or thereby, and the first to seventh transistors T1 to T7 may be implemented in only one of the P-type transistor and the N-type transistor.

Hereinafter, an input area (or an input electrode) of the N-type transistor will be referred to as a drain (or a drain area), an input area (or an input electrode) of the P-type transistor will be referred to as a source (or a source area), an output area (or an output electrode) of the N-type transistor will be referred to as a source (or a source area), and an output area (or an output electrode) of the P-type transistor will be referred to as a drain (or a drain area). However, at least one of the first to seventh transistors T1 to T7 may be omitted.

The first transistor T1 may be defined as a driving transistor, and the second transistor T2 may be defined as a switching transistor. The first capacitor CAP1 may be electrically connected between the first voltage line PL receiving the first power supply voltage ELVDD and a gate of the first transistor T1. The second capacitor CAP2 may be electrically connected between the first capacitor CAP1 and the second transistor T2. Each of the gate of the first transistor T1, the first capacitor CAP1, and the second capacitor CAP2 may be connected to a reference node. The first transistor T1 may be electrically connected between the first voltage line PL and one electrode (for example, an anode AE, of the light emitting element OLED). In the following descriptions, the expression "a transistor is electrically connected to a signal line" means that source, drain, or gate of a transistor is provided integrally with a signal line or connected to a signal line through a connection electrode, and "a transistor is electrically connected to a transistor" means that source, drain, or gate of one transistor is provided integrally with source, drain, or gate of another transistor or connected to source, drain, or gate of another transistor through a connection electrode.

A source of the first transistor T1 may be electrically connected to the first voltage line PL. Another transistor may be disposed or omitted between the source of the first transistor T1 and the first voltage line PL. A drain of the first transistor T1 may be electrically connected to the anode AE of the light emitting element OLED. Another transistor may be disposed or omitted between the drain of the first transistor T1 and the anode AE of the light emitting element OLED. The gate of the first transistor T1 may be electrically connected to the reference node. The first transistor T1 may control the amount of the current flowing through the light emitting element OLED in response to a voltage of the reference node, which is applied to the gate of the first transistor T1.

The second transistor T2 may be electrically connected between a j-th data line DLj and a source of the first transistor T1. A source of the second transistor T2 may be electrically connected to the j-th data line DLj, and a drain of the second transistor T2 may be electrically connected to the source of the first transistor T1. A gate of the second transistor T2 may be electrically connected to an i-th scan line SLi of the first group of scan lines.

The second transistor T2 may be turned on in response to an i-th write scan signal GWSi applied thereto via the i-th scan line SLi of the first group of scan lines and may electrically connect the data line DLj to the source of the first transistor T1. The second transistor T2 may perform a switching operation to provide a data voltage Vd applied thereto via the data line DLj to the source of the first transistor T1.

The third transistor T3 may be electrically connected between the reference node and the drain of the first transistor T1. A drain of the third transistor T3 may be electrically connected to the drain of the first transistor T1, and a source of the third transistor T3 may be electrically connected to the reference node. A gate of the third transistor T3 may be electrically connected to an i-th scan line GLi of the second group of scan lines. The third transistor T3 is shown to have one gate, however, it should not be limited thereto or thereby. According to an embodiment, the third transistor T3 may include gates.

The third transistor T3 may be defined as a compensation transistor. The third transistor T3 may be turned on in response to an i-th compensation scan signal GCSi applied thereto via the i-th scan line GLi of the second group of scan lines and may electrically connect the drain of the first transistor T1 to the gate of the first transistor T1. In case that the third transistor T3 is turned on, the first transistor T1 and the third transistor T3 may be connected in a diode configuration.

The fourth transistor T4 may be electrically connected between the reference node and the second voltage line VL1. A drain of the fourth transistor T4 may be electrically connected to the reference node, and a source of the fourth transistor T4 may be electrically connected to the second voltage line VL1. A gate of the fourth transistor T4 may be electrically connected to an i-th scan line HLi of the third group of scan lines. The fourth transistor T4 is shown to have one gate, however, it should not be limited thereto or thereby. According to an embodiment, the fourth transistor T4 may include gates.

The fourth transistor T4 may be defined as an initialization transistor. The fourth transistor T4 may be turned on in response to an i-th initialization scan signal GISi applied thereto via the i-th scan line HLi of the third group of scan lines and may provide a first initialization voltage Vint applied thereto via the second voltage line VL1 to the reference node.

The fifth transistor T5 may be electrically connected between the first voltage line PL and the source of the first transistor T1. A source of the fifth transistor T5 may be electrically connected to the first voltage line PL, and a drain of the fifth transistor T5 may be electrically connected to the source of the first transistor T1. A gate of the fifth transistor T5 may be electrically connected to the i-th light emitting line ELi.

The sixth transistor T6 may be electrically connected between the drain of the first transistor T1 and the light emitting element OLED. A source of the sixth transistor T6 may be electrically connected to the drain of the first transistor T1, and a drain of the sixth transistor T6 may be electrically connected to the anode AE of the light emitting element OLED. A gate of the sixth transistor T6 may be electrically connected to the i-th light emitting line ELi, however, it should not be limited thereto or thereby. The gate of the sixth transistor T6 may be connected to a signal line different from the signal line to which the gate of the fifth transistor T5 is connected.

The fifth transistor T5 and the sixth transistor T6 may be defined as light emission control transistors. The fifth transistor T5 and the sixth transistor T6 may be turned on in response to an i-th light emission signal ESi applied thereto via the i-th light emitting line ELi. The first power supply voltage ELVDD may be provided to the light emitting element OLED due to the turned-on fifth transistor T5 and sixth transistor T6, and thus, a driving current may flow through the light emitting element OLED, and the light emitting element OLED may emit the light.

In case that the fifth transistor T5 and the sixth transistor T6 are turned on, the amount of the current flowing through the first transistor T1 may be determined due to voltages charged in the capacitors CAP1 and CAP2. As the pixel PXij may include the plural capacitors CAP1 and CAP2, a capacitance of the pixel PXij may increase. However, the disclosure should not be limited thereto or thereby, and according to an embodiment, the second capacitor CAP2 may be omitted.

The seventh transistor T7 may be electrically connected between the drain of the sixth transistor T6 and the third voltage line VL2. A source of the seventh transistor T7 may be electrically connected to the drain of the sixth transistor T6, and a drain of the seventh transistor T7 may be electrically connected to the third voltage line VL2. A gate of the seventh transistor T7 may be electrically connected to an (i−1)th scan line SLi-1 of the first group of scan lines. The (i−1)th write scan line SLi-1 of the first group of scan lines may be defined as a write scan line of a previous state of the (i−1)th write scan line SLi of the first group of scan lines.

The seventh transistor T7 may be turned on in response to an (i−1)th write scan signal GWSi-1 applied thereto via the (i−1)th scan line SLi-1 of the first group of scan lines and may provide a second initialization voltage VAint applied thereto via the third voltage line VL2 to the anode AE of the light emitting element OLED. According to an embodiment, the second initialization voltage VAint may have the same level as that of the first initialization voltage Vint, however, it should not be limited thereto or thereby. According to an embodiment, the second initialization voltage VAint may have a different level from that of the first initialization voltage Vint.

The seventh transistor T7 may improve a black expression ability of the pixel PXij. In detail, in case that the seventh transistor T7 is turned on, a parasitic capacitance (not shown) of the light emitting element OLED may be discharged. Accordingly, in case that implementing a black luminance, the light emitting element OLED does not emit the light even though a leakage current occurs from the first transistor T1, and thus the black expression ability may be improved. However, according to an embodiment, the seventh transistor T7 may be omitted.

Referring to FIG. 2B, a driving circuit of the pixel PXij may include a light emitting element OLED, first, second, third, fourth, fifth, sixth, seventh, eighth, ninth, tenth, and eleventh transistors T1, T2, T3, T4, T5, T6, T7, T8, T9, T10, and T11, and first and second capacitors CAP1 and CAP2. The first to eleventh transistors Ti to T11 may be implemented in one of a P-type transistor and an N-type transistor. However, at least one of the first to eleventh transistors T1 to T11 may be omitted.

The driving circuit of the pixel PXij may be classified into a first circuit part and a second circuit part with respect to the first capacitor CAP1. As an example, the first circuit part may be connected to a first electrode of the first capacitor CAP1, and the second circuit part may be connected to a second electrode of the first capacitor CAP1. The second circuit part may be connected to the light emitting element OLED.

The first capacitor CAP1 may be electrically connected between a gate of the first transistor T1 and the second capacitor CAP2. The second capacitor CAP2 may be electrically connected between a first voltage line PL receiving a first power supply voltage ELVDD and the first capacitor CAP1. A first electrode of the second capacitor CAP2 and a first electrode of the first capacitor CAP1 may be connected to a first node, and a second electrode of the first capacitor CAP1 and the gate of the first transistor T1 may be connected to a second node.

A source of the first transistor T1 may be electrically connected to the first voltage line PL. The first transistor T1 may be electrically connected to the first voltage line PL via the ninth transistor T9. A drain of the first transistor T1 may be electrically connected to an anode AE of the light emitting element OLED. The first transistor T1 may be electrically connected to the anode AE of the light emitting element OLED via the sixth transistor T6. The gate of the first transistor T1 may be electrically connected to the second node.

The second transistor T2 may be electrically connected between a j-th data line DLj and the source of the first transistor T1. A source of the second transistor T2 may be electrically connected to the j-th data line DLj, and a drain of the second transistor T2 may be electrically connected to the tenth transistor T10. A gate of the second transistor T2 may be electrically connected to an i-th scan line SLi of a first group of scan lines.

The third transistor T3 may be electrically connected between the second node and the drain of the first transistor T1. A source of the third transistor T3 may be electrically connected to the drain of the first transistor T1, and a drain of the third transistor T3 may be electrically connected to the second node via the eleventh transistor T11. A gate of the third transistor T3 may be electrically connected to an i-th scan line GLi of the second group of scan lines.

The fourth transistor T4 may be electrically connected between the second node and a second voltage line VL1. A drain of the fourth transistor T4 may be electrically connected to the second node via the eleventh transistor T11, and a source of the fourth transistor T4 may be electrically connected to the second voltage line VL1. A gate of the fourth transistor T4 may be electrically connected to an i-th scan line HLi of the third group of scan lines. The second voltage line VL1 may transmit a first initialization voltage Vint to the pixel PXij.

A fifth transistor T5 may be electrically connected between a fourth voltage line VL3 and the second transistor T2. A source of the fifth transistor T5 may be electrically connected to the fourth voltage line VL3. The fourth voltage line VL3 may transmit a reference voltage Vref to the pixel PXij. A drain of the fifth transistor T5 may be electrically connected to the drain of the second transistor T2 with a third node interposed therebetween. A gate of the fifth transistor T5 may be electrically connected to the i-th scan line GLi of the second group of scan lines. The fifth transistor T5 may be turned on in response to a scan signal applied thereto via the i-th scan line GLi of the second group of scan lines and may provide the reference voltage Vref to the third node.

The sixth transistor T6 may be electrically connected to the drain of the first transistor T1 and the light emitting element OLED. A source of the sixth transistor T6 may be electrically connected to the drain of the first transistor T1, and a drain of the sixth transistor T6 may be electrically connected to the anode AE of the light emitting element OLED. A gate of the sixth transistor T6 may be electrically connected to an i-th light emitting line EL1*i* of a first group.

The seventh transistor T7 may be electrically connected between the drain of the sixth transistor T6 and the third voltage line VL2. A source of the seventh transistor T7 may be electrically connected to the drain of the sixth transistor T6, and a drain of the seventh transistor T7 may be electrically connected to the third voltage line VL2. The third voltage line VL2 may provide a second initialization voltage VAint to the pixel PXij. A gate of the seventh transistor T7 may be electrically connected to an (i−1)th scan line SLi-1 of the first group of scan lines, however, it should not be limited thereto or thereby. A gate of the seventh transistor T7 may be connected to a scan line of a separate group.

The eighth transistor T8 may be electrically connected between a fifth voltage line VL4 and the source of the first transistor T1. A source of the eighth transistor T8 may be electrically connected to the fifth voltage line VL4. The fifth voltage line VL4 may provide a bias voltage Vbias to the pixel PXij. A drain of the eighth transistor T8 may be electrically connected to the source of the first transistor T1. A gate of the eighth transistor T8 may be electrically connected to an i-th scan line EMLi of a fourth group of scan lines.

The ninth transistor T9 may be electrically connected between the first voltage line PL and the source of the first transistor T1. A source of the ninth transistor T9 may be electrically connected to the first voltage line PL. The first voltage line PL may provide the first power supply voltage ELVDD to the pixel PXij. A drain of the ninth transistor T9 may be connected to the source of the first transistor T1. A gate of the ninth transistor T9 may be electrically connected to an i-th light emitting line EL2*i* of a second group.

The tenth transistor T10 may be connected between the first capacitor CAP1 and the second transistor T2. A source of the tenth transistor T10 may be electrically connected to the first node. A drain of the tenth transistor T10 may be electrically connected to the drain of the second transistor T2. A gate of the tenth transistor T10 may be electrically connected to an i-th scan line GL2*i* of a fifth group of scan lines.

The eleventh transistor T11 may be electrically connected between the first capacitor CAP1 and the fourth transistor T4. A source of the eleventh transistor T11 may be electrically connected to the drain of the fourth transistor T4. A drain of the eleventh transistor T11 may be electrically connected to the second node. A gate of the eleventh transistor T11 may be electrically connected to the i-th scan line GL2*i* of the fifth group of scan lines.

However, the driving circuits of the pixels respectively shown in FIGS. 2A and 2B are examples, and the configurations of the driving circuit may be changed in various ways.

Figure 3B:
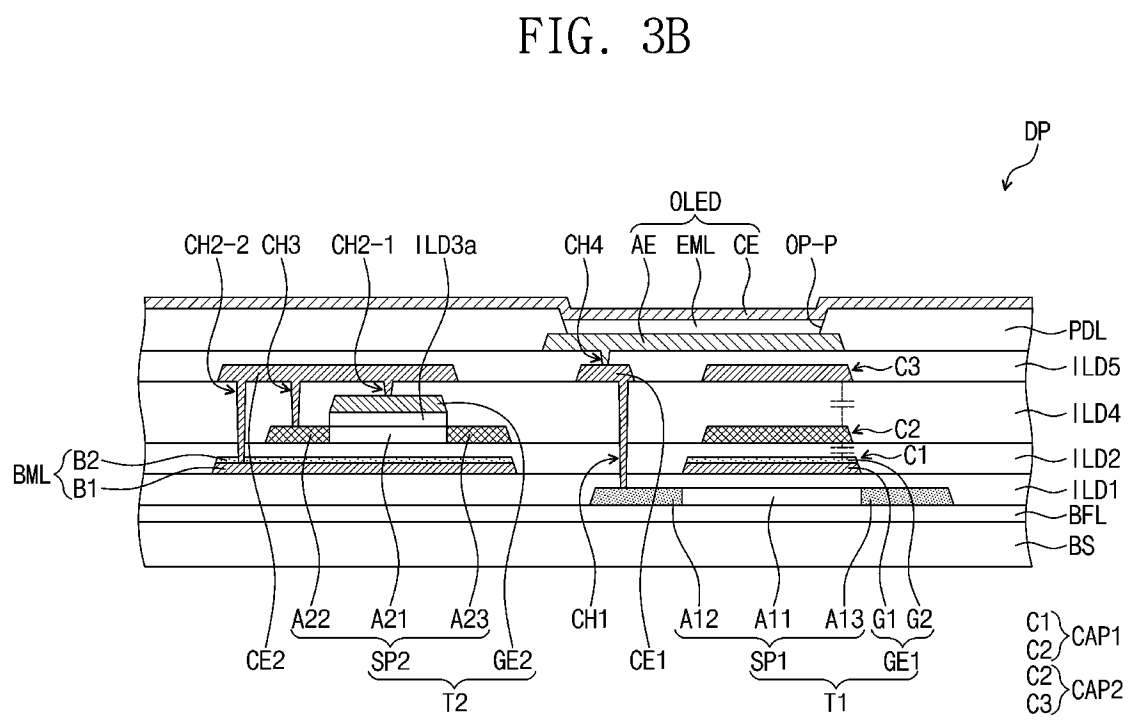

FIGS. 3A and 3B are schematic cross-sectional views of display panels DP according to embodiments. For the convenience of explanation, FIGS. 3A and 3B show a base substrate BS, insulating layers ILD1, ILD2, ILD3, ILD4, and ILD5, a first transistor T1, a second transistor T2, a first capacitor CAP1, a second capacitor CAP2, and a light emitting element OLED.

The terms "first" and "second" are used to distinguish the transistors from each other and are not limited to the first transistor T1 and the second transistor T2 shown in FIGS. 2A and 2B. Each of the first transistor T1 and the second transistor T2 described hereinafter may correspond to one transistor among the transistors (for example, the first to seventh transistors in FIG. 2A or the first to eleventh transistors in FIG. 2B) described above.

Referring to FIGS. 3A and 3B, the base substrate BS may provide a base surface on which the first and second transistors T1 and T2 are disposed. The base substrate BS may include an insulating material. The base substrate BS may be a glass substrate, a metal substrate, or an organic/inorganic composite material substrate. The base substrate BS may have a single-layer or multi-layer structure.

At least one inorganic layer forming a barrier layer and/or a buffer layer may be disposed on an upper surface of the base substrate BS. FIGS. 3A and 3B show a buffer layer BFL disposed on the base substrate BS. The buffer layer BFL may include at least one of aluminum oxide, titanium oxide, silicon oxide, silicon nitride, silicon oxynitride, zirconium oxide, and hafnium oxide, however, a material for the buffer layer BFL should not be limited thereto or thereby. The buffer layer BFL may increase an adhesion between the base substrate BS and semiconductor patterns SP1 and SP2 of the transistors T1 and T2.

Although not shown in figures, the display panel DP may further include a blocking layer disposed between the buffer layer BFL and the base substrate BS. The blocking layer may be disposed to overlap the first semiconductor pattern SP1 of the first transistor T1 and may prevent the first semiconductor pattern SP1 of the first transistor T1 from being damaged by the external light.

The insulating layers ILD1 to ILD5 may include first, second, third, fourth, and fifth insulating layers ILD1, ILD2, ILD3, ILD4, and ILD5 sequentially stacked on the base substrate BS. Each of the first, second, third, fourth, and fifth insulating layers ILD1, ILD2, ILD3, ILD4, and ILD5 may include an organic layer or an inorganic layer. As an example, the inorganic layer of the insulating layers ILD1 to ILD5 may include at least one of aluminum oxide, titanium oxide, silicon oxide, silicon nitride, silicon oxynitride, zirconium oxide, and hafnium oxide. The organic layer of the insulating layers ILD1 to ILD5 may include a phenolic-based polymer, an acrylic-based polymer, an imide-based polymer, an aryl ether-based polymer, an amide-based polymer, a fluorine-based polymer, a p-xylene-based polymer, a vinyl alcohol-based polymer, or blends thereof. However, materials for the first to fifth insulating layers ILD1 to ILD5 should not be limited thereto or thereby. Configurations of the insulating layers should not be limited to figures. According to an embodiment, the insulating layers may further include an additional insulating layer in addition to the first to fifth insulating layers ILD1 to ILD5, or one of the first to fifth insulating layers ILD1 to ILD5 may be omitted.

In a manufacturing process of the display panel DP, an insulating layer, a semiconductor layer, and a conductive layer may be formed by coating or deposition processes. The insulating layer, the semiconductor layer, and the conductive layer may be selectively patterned by a photolithography process. The semiconductor patterns SP1 and SP2, the conductive patterns, and the signal lines, which form the display panel DP, may be formed by the above-mentioned method.

Referring to FIGS. 3A and 3B, the first transistor T1 may include the first semiconductor pattern SP1 and a first gate electrode GE1, and the second transistor T2 may include the second semiconductor pattern SP2 and a second gate electrode GE2.

The first semiconductor pattern SP1 may be disposed on the base substrate BS. According to an embodiment, the first semiconductor pattern SP1 may be disposed on the buffer layer BFL. The first semiconductor pattern SP1 may include areas having different electrical properties depending on whether or not it is doped (for example, whether it is doped with an N-type dopant or a P-type dopant). The first semiconductor pattern SP1 may include an active area A11 and conductive areas A12 and A13 spaced apart from each other with the active area A11 interposed therebetween. One of the conductive areas A12 and A13 may correspond to a source area of the semiconductor pattern SP1, and the other of the conductive areas A12 and A13 may correspond to a drain area of the semiconductor pattern SP1.

In detail, the first semiconductor pattern SP1 may include a first region with a high conductivity and a second region with a low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may substantially serve as a source and a drain of the transistor. The second region may substantially correspond to an active (or a channel) of the transistor.

The first semiconductor pattern SP1 may include a silicon semiconductor pattern. As an example, the first semiconductor pattern SP1 may include polysilicon or amorphous silicon, however, it should not be limited thereto or thereby. According to an embodiment, the first semiconductor pattern SP1 may include metal oxide.

The first insulating layer ILD1 may be disposed on the buffer layer BFL and may cover or overlap the first semiconductor pattern SP1. According to an embodiment, the first insulating layer ILD1 may be an inorganic layer including at least one of silicon nitride ($SiN_x$) and silicon oxide ($SiO_x$), however, the embodiment should not be limited thereto or thereby.

The first gate electrode GE1 may be disposed on the first insulating layer ILD1. The first gate electrode GE1 may overlap the active area A11 of the first semiconductor pattern SP1. The first gate electrode GE1 may serve as a mask in a process of doping the first semiconductor pattern SP1.

The first gate electrode GE1 may include layers. According to an embodiment, the first gate electrode GE1 may include a first layer G1 and a second layer G2, which may be sequentially stacked each other in a thickness direction. The first layer G1 may include a conductive material. As an example, the first layer G1 may include titanium (Ti), aluminum (Al), etc., within the spirit and the scope of the disclosure. However, a material for the first layer G1 should not be limited thereto or thereby. The first layer G1 may have a multi-layer structure in which conductive layers may be stacked each other.

The second layer G2 may be in contact with an upper surface of the first layer G1. In the manufacturing process of the display panel DP, the second layer G2 may prevent the first layer G1 from being damaged, and this will be described in detail later in the manufacturing process of the display panel DP. According to an embodiment, the second layer G2 may include titanium nitride ($TiN_x$), however, a material for the second layer G2 should not be limited thereto or thereby.

The scan lines SL1 to SLn, GL1 to GLn, and HL1 to HLn (refer to FIG. 1) may be formed through a same process as and may be disposed on a same layer as the first gate electrode GE1. The scan lines SL1 to SLn, GL1 to GLn, HL1 to HLn (refer to FIG. 1) may include a same material or a similar material as that of the first gate electrode GE1. Accordingly, the first layer G1 of the first gate electrode GE1 may include the conductive material with a relatively low resistance. Since the first gate electrode GE1 and the scan lines SL1 to SLn, GL1 to GLn, and HL1 to HLn (refer to FIG. 1) are formed through a same process, the number of masks required for the process may be reduced. The process may be simplified, and thus, a process cost may be reduced.

The display panel DP may further include a blocking layer BML disposed on a same layer as a layer on which the first gate electrode GE1 is disposed. The blocking layer BML may be formed through a same process as the first gate electrode GE1 without adding a separate process. Accordingly, the process may be simplified, and the process cost may be reduced.

The blocking layer BML may include a same material or a similar material as that of the first gate electrode GE1. As an example, the blocking layer BML may include a first layer B1 and a second layer B2 disposed on the first layer B1, and the first layer B1 and the second layer B2 of the blocking layer BML may include the same materials or similar materials as those of the first layer G1 and the second layer G2 of the first gate electrode GE1, respectively.

The blocking layer BML may overlap the second semiconductor pattern SP2 of the second transistor T2. The blocking layer BML may prevent the second semiconductor pattern SP2 of the second transistor T2 from being damaged due to the external light.

The blocking layer BML may overlap an active area A21 of the second semiconductor pattern SP2. For example, the active area A21 of the second semiconductor pattern SP2 may be disposed between the blocking layer BML and the second gate electrode GE2 in the thickness direction and may overlap the blocking layer BML and the second gate electrode GE2. According to an embodiment, the blocking layer BML may be electrically connected to the second gate electrode GE2 of the second transistor T2 and the second semiconductor pattern SP2 and may serve as an additional gate electrode. As the blocking layer BML serves as the additional gate electrode, an output synchronization of the second transistor T2 may be performed quickly, and thus, electrical characteristics of the pixel may be improved.

The second insulating layer ILD2 may be disposed on the first insulating layer ILD1 and may cover or overlap the first gate electrode GE1 and the blocking layer BML. According to an embodiment, the second insulating layer ILD2 may be an inorganic layer including at least one of silicon nitride ($SiN_x$) and silicon oxide ($SiO_x$). As an example, the second insulating layer ILD2 may have a multi-layer structure of the inorganic layers (for example, a structure in which silicon nitride ($SiN_x$) and silicon oxide ($SiO_x$) may be stacked each other). However, a material for the second insulating layer ILD2 should not be particularly limited.

The second semiconductor pattern SP2 may be disposed on a layer different from a layer on which the first semiconductor pattern SP1 is disposed. According to an embodiment, the second semiconductor pattern SP2 may be disposed on the second insulating layer ILD2.

The second semiconductor pattern SP2 may include a semiconductor pattern different from the first semiconductor pattern SP1. As an example, the first semiconductor pattern SP1 may include a silicon semiconductor pattern, and the second semiconductor pattern SP2 may include an oxide semiconductor pattern. As an example, the oxide semiconductor may include the metal oxide of metals, such as zinc (Zn), indium (In), gallium (Ga), tin (Sn), titanium (Ti), etc., or a mixture of the metal, such as zinc (Zn), indium (In), gallium (Ga), tin (Sn), titanium (Ti), etc., and oxides thereof. According to an embodiment, the oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), or the like within the spirit and the scope of the disclosure.

The second semiconductor pattern SP2 may include the metal oxide and may include areas having different electrical properties depending on whether the metal oxide is doped or reduced. The second semiconductor pattern SP2 may include an active area A21 and conductive areas A22 and A23 spaced apart from each other with the active area A21 interposed therebetween. One of the conductive areas A22 and A23 may correspond to the source area of the second semiconductor pattern SP2, and the other of the conductive areas A22 and A23 may correspond to the drain area of the second semiconductor pattern SP2.

In detail, the second semiconductor pattern SP2 may include areas distinguished from each other depending on whether the metal oxide is reduced. An area (hereinafter, referred to as a reduced area) where the metal oxide is reduced may have a conductivity higher than that of an area (hereinafter, referred to as a non-reduced area) where the metal oxide is not reduced. The reduced area may substantially act as the source electrode or the drain electrode of the transistor. The non-reduced area may substantially correspond to the active (or channel) of the transistor.

The third insulating layer ILD3 may be disposed on the second insulating layer ILD2 and may cover or overlap the second semiconductor pattern SP2. The second gate electrode GE2 may be disposed on the third insulating layer ILD3. The second gate electrode GE2 may overlap the active area A21 of the second semiconductor pattern SP2. According to an embodiment, the second gate electrode GE2 may serve as a mask in a process of doping the second semiconductor pattern SP2.

Referring to FIG. 3A, the third insulating layer ILD3 may overlap the first transistor T1. For example, the third insulating layer ILD3 may be disposed on the first gate electrode GE1 and may cover or overlap the first gate electrode GE1.

However, the embodiment should not be limited thereto or thereby. As shown in FIG. 3B, a third insulating layer ILD3*a* may be provided in the form of an insulating pattern. Hereinafter, the third insulating layer ILD3*a* of FIG. 3B is referred to as an insulating pattern ILD3*a*. The second gate electrode GE2 may be spaced apart from the active area A21 of the second semiconductor pattern SP2 with the insulating pattern ILD3*a* interposed therebetween in case that viewed in a cross-section. The second gate electrode GE2 and the insulating pattern ILD3*a* may be formed by forming an insulating layer and a conductive layer on the second semiconductor pattern SP2 of the second transistor T2 and patterning the insulating layer and the conductive layer. The second gate electrode GE2 may serve as a mask in a process of forming the insulating pattern ILD3*a*.

The insulating pattern ILD3*a* may not overlap the first transistor T1. For example, the third insulating layer ILD3*a* provided in the form of the insulating pattern may not overlap the first transistor T1. Accordingly, the patterned third insulating layer ILD3*a* may not be disposed in an area in which the first transistor T1 is disposed, and the fourth insulating layer ILD4 may be disposed right above the second insulating layer ILD2 in the area in which the first transistor T1 is disposed.

The second gate electrode GE2 may include a conductive material. As an example, the second gate electrode GE2 may include molybdenum (Mo), titanium (Ti), or the like within the spirit and the scope of the disclosure. However, a material for the second gate electrode GE2 should not be limited thereto or thereby.

The second gate electrode GE2 may have a multi-layer structure of conductive layers that may be sequentially stacked each other. According to an embodiment, the second gate electrode GE2 may have a stack structure different from a stack structure of the first gate electrode GE1. As an example, the second gate electrode GE2 may have two conductive layers of Mo/Ti, and the first gate electrode GE1 may include the first layer G1 containing Ti/AL and the second layer G2 containing titanium nitride ($TiN_x$). However, the second gate electrode GE2 should not be limited thereto or thereby.

The fourth insulating layer ILD4 may be disposed on the third insulating layer ILD3 and may cover or overlap the second gate electrode GE2. According to an embodiment, the fourth insulating layer ILD4 may be an inorganic layer including at least one of silicon nitride ($SiN_x$) and silicon oxide ($SiO_x$). As an example, the fourth insulating layer ILD4 may have a multi-layer structure of the inorganic layers (for example, a structure in which silicon nitride ($SiN_x$) and silicon oxide ($SiO_x$) may be stacked each other). However, a material for the fourth insulating layer ILD4 should not be particularly limited.

The fourth insulating layer ILD4 may include a same material or a similar material as that of the second insulating layer ILD2. According to an embodiment, the fourth insulating layer ILD4 may be formed under the same condition as the second insulating layer ILD2, and the fourth insulating layer ILD4 may have a same stack structure as the stack structure of the second insulating layer ILD2. However, the fourth insulating layer ILD4 should not be limited thereto or thereby.

The display panel DP may include connection electrodes CE1 and CE2 respectively connected to the semiconductor patterns SP1 and SP2 of the first and second transistors T1 and T2. FIGS. 3A and 3B show a first connection electrode CE1 connected to the first semiconductor pattern SP1 and a second connection electrode CE2 connected to the second semiconductor pattern SP2.

The first connection electrode CE1 may be disposed on a layer different from the first semiconductor pattern SP1 and may be connected to the first semiconductor pattern SP1 via a contact hole CH1 defined through at least one insulating layer. Referring to FIGS. 3A and 3B, the first connection electrode CE1 may be disposed on the fourth insulating layer ILD4 and may be connected to the first semiconductor pattern SP1 via the contact hole CH1 defined through the first to fourth insulating layers ILD1 to ILD4.

The second connection electrode CE2 may be disposed on a layer different from the second semiconductor pattern SP2 and may be connected to the second semiconductor pattern SP2 via a contact hole CH3 defined through at least one insulating layer. Referring to FIG. 3A, the second connection electrode CE2 may be disposed on the fourth insulating layer ILD4 and may be connected to the second semiconductor pattern SP2 via the contact hole CH3 defined through the third and fourth insulating layers ILD3 and ILD4. Referring to FIG. 3B, the second connection electrode CE2 may be disposed on the fourth insulating layer ILD4 and may be connected to the second semiconductor pattern SP2 via the contact hole CH3 defined through the fourth insulating layer ILD4.

According to an embodiment, the second connection electrode CE2 may be connected to the second gate electrode GE2 and the blocking layer BML. The second connection electrode CE2 may be connected to the second gate electrode GE2 via a contact hole CH2-1 defined through the fourth insulating layer ILD4. The second connection electrode CE2 may be connected to the blocking layer BML via a contact hole CH2-2 defined through the second to fourth insulating layers ILD2 to ILD4. Accordingly, the second connection electrode CE2 may electrically connect the second gate electrode GE2 to the blocking layer BML, and the blocking layer BML may serve as an addition gate electrode.

The contact hole CH2-2 through which a portion of the blocking layer BML is exposed may be formed through the second layer B2 of the blocking layer BML. The second layer B2 may serve as a sacrificial layer to protect the first layer B1 of the blocking layer BML in a process of forming the contact holes CH1, CH2-1, and CH2-2, and thus, a portion of the second layer B2 may be removed. Therefore, a portion of the first layer B1 of the blocking layer BML may be exposed, and the second connection electrode CE2 may be connected to the first layer B1 of the blocking layer BML, which has a relatively high conductivity.

Each of the first connection electrode CE1 and the second connection electrode CE2 may include a conductive material. Each of the first connection electrode CE1 and the second connection electrode CE2 may have a multi-layer structure in which conductive layers may be stacked each other. As an example, each of the first connection electrode CE1 and the second connection electrode CE2 may include three conductive layers of Ti/Al/Ti. However, materials for the first connection electrode CE1 and the second connection electrode CE2 should not be limited thereto or thereby.

The first connection electrode CE1 and the second connection electrode CE2 may be disposed on a same layer. The first connection electrode CE1 and the second connection electrode CE2 may be simultaneously formed through a same process and may include the same materials or similar materials as each other. The first connection electrode CE1 and the second connection electrode CE2 may be simultaneously formed through one mask, and thus, processes of the first connection electrode CE1 and the second connection electrode CE2 may be simplified.

The fifth insulating layer ILD5 may be disposed on the first and second connection electrodes CE1 and CE2. According to an embodiment, the fifth insulating layer ILD5 may include an organic layer and may provide a flat upper surface thereon on which the light emitting element OLED is disposed. The fifth insulating layer ILD5 may be formed as a single insulating layer. Accordingly, a deposition process of forming the fifth insulating layer ILD5 may be simplified. However, the fifth insulating layer ILD5 should not be limited thereto or thereby.

The data lines DL1 to DLn (refer to FIG. 1) may be formed through a same process as and may be disposed on a same layer as the first connection electrode CE1. The data lines DL1 to DLn (refer to FIG. 1) may include a same material or a similar material as that of the first connection electrode CE1. Since the first connection electrode CE1 and the data lines DL1 to DLn (refer to FIG. 1) are formed through a same process, the number of masks required for the process may be reduced. The process may be simplified, and thus, a process cost may be reduced.

The display panel DP may include at least one capacitor formed by electrodes overlapping each other in case that viewed in a plan view. Referring to FIGS. 3A and 3B, the display panel DP may include the first and second capacitors CAP1 and CAP2.

As shown in FIGS. 3A and 3B, the first and second capacitors CAP1 and CAP2 may be stacked each other in the thickness direction of the display panel DP. The first and second capacitors CAP1 and CAP2 may be formed by the first gate electrode GE1, a first upper electrode C2, and a second upper electrode C3.

The first upper electrode C2 may be disposed to overlap the first gate electrode GE1 in case that viewed in a plan view to form the first capacitor CAP1. For example, the first electrode C1 of the first capacitor CAP1 may be defined by a portion of the first gate electrode GE1, which overlaps the first upper electrode C2 in case that viewed in a plan view. The first electrode C1 of the first capacitor CAP1 and the first gate electrode GE1 may be integral with each other (for example, an integral shape), on the first insulating layer ILD1. The second electrode of the first capacitor CAP1 may correspond to the first upper electrode C2.

The second upper electrode C3 may be disposed to overlap the first upper electrode C2 in case that viewed in a plan view and thus may form the second capacitor CAP2. The first upper electrode C2 may be one electrode of the first capacitor CAP1 and one electrode of the second capacitor CAP2.

In an embodiment, the first transistor T1, and the first and second capacitors CAP1 and CAP2 may be sequentially stacked each other, however, they should not be limited thereto or thereby. According to an embodiment, the first transistor T1 and the first and second capacitors CAP1 and CAP2 may be disposed to overlap each other in case that viewed in a plan view or may be disposed not to overlap each other. A portion of the first gate electrode GE1, which overlaps the active area A11, may form the first transistor T1, and the other portion of the first gate electrode GE1 may overlap the first upper electrode C2 to form the first capacitor CAP1. In the display panel DP according to an embodiment, the first and second capacitors CAP1 and CAP2 may be formed at various positions in case that viewed in a plan view as long as the first and second capacitors CAP1 and CAP2 are formed by the first gate electrode GE1, the first upper electrode C2, and the second upper electrode C3, however, they should not be particularly limited.

As the first and second capacitors CAP1 and CAP2 are formed, the capacitance of the pixel of the display panel DP may be sufficiently secured. As the second electrode of the first capacitor CAP1 and the first electrode of the second capacitor CAP2 are formed using an integral electrode, the process of forming the first and second capacitors CAP1 and CAP2 may be simplified, and a degree of integration of the pixels may be improved. However, the embodiment should not be limited thereto or thereby, and according to an embodiment, the display panel DP may include one capacitor formed to correspond to the pixel. One of the first upper electrode C2 and the second upper electrode C3 may be omitted.

A stacking position of the first upper electrode C2 may be changed in various ways according to embodiments of the display panel DP. FIGS. 3A and 3B respectively show embodiments in which stacking positions of the first upper electrode C2 forming the first capacitor CAP1 and the second capacitor CAP2 are different.

Referring to FIG. 3A, the first upper electrode C2 may be disposed on a same layer as the second gate electrode GE2. The first upper electrode C2 may include a same material or a similar material as that of the second gate electrode GE2. The first upper electrode C2 and the second gate electrode GE2 may be formed through a same process using one mask. Accordingly, the process of forming the first capacitor CAP1 may be simplified, and thus, the process cost may be reduced.

In case that viewed in a cross-section, the second insulating layer ILD2 and the third insulating layer ILD3 may overlap the first gate electrode GE1 and the first upper electrode C2 and may be disposed between the first gate electrode GE1 and the first upper electrode C2. For example, the second insulating layer ILD2 and the third insulating layer ILD3 may be disposed between the electrodes forming the first capacitor CAP1. Accordingly, a capacity and an efficiency of the first capacitor CAP1 may be affected by a material, a thickness, and a dielectric permittivity of each of the second insulating layer ILD2 and the third insulating layer ILD3. The first capacitor CAP1 with a required capacitance may be formed by adjusting the material and the thickness of the second insulating layer ILD2 and the third insulating layer ILD3.

The inorganic layer included in the second insulating layer ILD2 may have a dielectric permittivity. As an example, the second insulating layer ILD2 may include silicon nitride ($SiN_x$) and silicon oxide ($SiO_x$), silicon nitride ($SiN_x$) may have the dielectric permittivity equal to or greater than about 6 and equal to or smaller than about 8, and silicon oxide ($SiO_x$) may have the dielectric permittivity equal to or greater than about 3.8 and equal to or smaller than about 5.

The inorganic layer included in the third insulating layer ILD3 may have a dielectric permittivity. The third insulating layer ILD3 may be formed as a single inorganic layer containing silicon oxide ($SiO_x$), and silicon oxide ($SiO_x$) may have the dielectric permittivity equal to or greater than about 3.8 and equal to or smaller than about 5. However, according to an embodiment, the third insulating layer ILD3 may include both silicon nitride ($SiN_x$) and silicon oxide ($SiO_x$).

Each of the second insulating layer ILD2 and the third insulating layer ILD3 may have a thickness. As an example, the thickness of the second insulating layer ILD2 may be equal to or greater than about 1000 angstroms and equal to or smaller than about 10000 angstroms. The thickness of the third insulating layer ILD3 may be equal to or greater than about 500 angstroms and equal to or smaller than about 5000 angstroms. However, the thickness of each of the second insulating layer ILD2 and the third insulating layer ILD3 should not be limited thereto or thereby.

The second insulating layer ILD2 may include the inorganic layers, and the capacitance of the first capacitor CAP1 may be changed depending on the thickness of each of the inorganic layers included in the second insulating layer ILD2. As an example, the second insulating layer ILD2 may include at least one silicon nitride ($SiN_x$) layer and at least one silicon oxide ($SiO_x$) layer, and a sum of thicknesses of silicon nitride ($SiN_x$) layers forming the second insulating layer ILD2 may be equal to or greater than one times and equal to or smaller than about twenty times a sum of thicknesses of silicon oxide ($SiO_x$) layers forming the second insulating layer ILD2. According to an embodiment, the thickness of the silicon nitride ($SiN_x$) layer included in the second insulating layer ILD2 may be required to be equal to or greater than about 500 angstroms. However, the thickness of the second insulating layer ILD2 should not be limited thereto or thereby.

According to an embodiment, the third insulating layer ILD3 may include the inorganic layers. As an example, the third insulating layer ILD3 may include silicon nitride ($SiN_x$) layer and silicon oxide ($SiO_x$) layer. According to an embodiment, a maximum of the thickness of the silicon nitride ($SiN_x$) layer included in the third insulating layer ILD3 may be about 300 angstroms. However, the thickness of the third insulating layer ILD3 should not be limited thereto or thereby.

Referring to FIG. 3A, the second upper electrode C3 may be disposed on a same layer as the first connection electrode CE1. The second upper electrode C3 may include a same material or a similar material as the first connection electrode CE1. The second upper electrode C3 and the first connection electrode CE1 may be formed through a same process using one mask. Accordingly, the second capacitor CAP2 may be formed without adding a process using a separate mask, and thus, the process of forming the second capacitor CAP2 may be simplified. As a result, the process cost may be reduced.

In case that viewed in a cross-section, the fourth insulating layer ILD4 may overlap the first upper electrode C2 and the second upper electrode C3 and may be disposed between the first upper electrode C2 and the second upper electrode C3. For example, the fourth insulating layer ILD4 may be disposed between the electrodes C2 and C3 forming the second capacitor CAP2. Accordingly, a capacity and an efficiency of the second capacitor CAP2 may be affected by a material, a thickness, and a dielectric permittivity of the fourth insulating layer ILD4. The second capacitor CAP2 with a required capacitance may be formed by adjusting the material and the thickness of the fourth insulating layer ILD4.

The fourth insulating layer ILD4 may include at least one inorganic layer having a thickness, and the inorganic layer included in the fourth insulating layer ILD4 may have a dielectric permittivity. The descriptions on the configuration and the thickness of the second insulating layer ILD2 may be applied to the inorganic layer of the fourth insulating layer ILD4.

Referring to FIG. 3B, the first upper electrode C2 may be disposed on a same layer as the second semiconductor pattern SP2. The first upper electrode C2 may include a same material or a similar material as the second semiconductor pattern SP2. As an example, the first upper electrode C2 may include a metal oxide. The first upper electrode C2 and the second semiconductor pattern SP2 may be formed through a same process using one mask. Accordingly, a process of forming an electrode of the first capacitor CAP1 may be simplified, and thus, a process cost may be reduced.

In case that viewed in a cross-section, the second insulating layer ILD2 may be disposed between the first gate electrode GE1 and the first upper electrode C2. For example, the second insulating layer ILD2 may be disposed between the electrodes C1 and C2 forming the first capacitor CAP1. In case that compared with the first capacitor CAP1 of FIG. 3A, a thickness of the insulating layer disposed between the electrodes C1 and C2 of the first capacitor CAP1 of FIG. 3B may be reduced. In case that the first electrode C1 and the first upper electrode C2 of the first capacitor CAP1 of FIG. 3A respectively have a same thickness of the first electrode C1 and the first upper electrode C2 of the first capacitor CAP1 of FIG. 3B, the first capacitor CAP1 of FIG. 3B may have a capacitance greater than the capacitance of the first capacitor CAP1 of FIG. 3A.

As described above, the third insulating layer ILD3*a* of FIG. 3B may be provided in the form of the insulating pattern. Accordingly, the third insulating layer ILD3*a* may not be disposed between the first upper electrode C2 disposed on the second insulating layer ILD2 and the second upper electrode C3 disposed on the fourth insulating layer ILD4. For example, the third insulating layer ILD3*a* may not overlap the electrodes C2 and C3 forming the second capacitor CAP2 in case that viewed in a plan view. Accordingly, only the fourth insulating layer ILD4 may be disposed between the first upper electrode C2 and the second upper electrode C3 in case that viewed in the cross-section.

Referring to FIGS. 3A and 3B again, the light emitting element OLED may be disposed on the fifth insulating layer ILD5. The light emitting element OLED may include a pixel electrode AE, a light emitting layer EML, and an opposite electrode CE. The pixel electrode AE of the light emitting element OLED may be the anode AE of FIGS. 2A and 2B, and the opposite electrode CE may be the cathode CE of FIGS. 2A and 2B.

The pixel electrode AE may be disposed on the fifth insulating layer ILD5. The pixel electrode AE may be connected to the first connection electrode CE1 via a contact hole CH4 defined through the fifth insulating layer ILD5. The fifth insulating layer ILD5 disposed between the pixel electrode AE and the first connection electrode CE1 may have a single-insulating layer structure.

A pixel definition layer PDL may be disposed on the pixel electrode AE and the fifth insulating layer ILD5 to expose at least a portion of the pixel electrode AE. A light emitting opening OP-P may be defined through the pixel definition layer PDL to expose the portion of the pixel electrode AE. In an embodiment, the portion of the pixel electrode AE exposed through the light emitting opening OP-P may correspond to the light emitting area.

The pixel definition layer PDL may include an organic material, however, it should not be limited thereto or thereby. According to an embodiment, the pixel definition layer PDL may further include an inorganic material. The pixel definition layer PDL may have a color. As an example, the pixel definition layer PDL may include a base resin and a black pigment or a black dye mixed with the base resin, however, the pixel definition layer PDL should not be particularly limited.

The light emitting layer EML may be disposed on the pixel electrode AE. The light emitting layer EML may be provided in the form of a light emitting pattern disposed in an area corresponding to the light emitting opening OP-P, however, it should not be limited thereto or thereby. According to an embodiment, the light emitting layer EML may have an integral shape to correspond to the pixels. The light emitting layer EML may include an organic and/or inorganic material, a quantum dot, or a quantum rod. The light emitting layer EML may emit a light having one of red, green, and blue colors.

The opposite electrode CE may be disposed on the light emitting layer EML. A portion of the opposite electrode CE may be disposed on an upper surface of the pixel definition layer PDL. The opposite electrode CE may be provided as a common layer that is commonly disposed over the pixels.

Each of the pixel electrode AE and the opposite electrode CE may include at least one selected from, two or more compounds selected from, two or more mixtures selected from, or oxide of Ag, Mg, Cu, Al, Pt, Pd, Au, Ni, Nd, Ir, Cr, Li, Ca, LiF, Mo, Ti, W, In, Sn, and Zn.

Each of the pixel electrode AE and the opposite electrode CE may be a transmissive electrode, a transflective electrode, or a reflective electrode. The transmissive electrode may include a transparent metal oxide, for example, indium tin oxide (ITO), indium zinc oxide (IZO), zinc oxide (ZnO), indium tin zinc oxide (ITZO), etc., within the spirit and the scope of the disclosure. The transflective electrode or the reflective electrode may include Ag, Mg, Cu, Al, Pt, Pd, Au, Ni, Nd, Ir, Cr, Li, Ca, LiF/Ca (a stack structure of LiF and Ca), LiF/Al (a stack structure of LiF and Al), Mo, Ti, Yb, W, a compound thereof, or a mixture thereof, for example, AgMg, AgYb, or MgYb.

Each of the pixel electrode AE and the opposite electrode CE may have a multi-layer structure of the reflective layer or the semi-transmissive layer, which is formed of the above-mentioned material, and the transparent conductive layer formed of indium tin oxide (ITO), indium zinc oxide (IZO), zinc oxide (ZnO), or indium tin zinc oxide (ITZO). As an example, the pixel electrode AE and the opposite electrode CE may have a three-layer structure of ITO/Ag/ITO, however, it should not be limited thereto or thereby.

In case that the first power supply voltage ELVDD (refer to FIG. 1) and the second power supply voltage ELVSS (refer to FIG. 1) are respectively applied to the pixel electrode AE and the opposite electrode CE, holes and electrons, which are injected into the light emitting layer EML, may be recombined with each other to generate excitons. The light emitting element OLED may emit the light in case that the excitons return to a ground state from an excited state. As the light emitting element OLED emits the light, the display panel DP may display the image through the display surface.

However, the light emitting element OLED may further include at least one functional layer disposed between the pixel electrode AE and the opposite electrode CE. As an example, the light emitting element OLED may further include a hole control layer disposed between the first electrode AE and the light emitting layer EML and an electron control layer disposed between the light emitting layer EML and the opposite electrode CE. The hole control layer may include at least one of a hole transport layer and a hole injection layer, and the electron control layer may include at least one of an electron transport layer and an electron injection layer.

Although not shown in figures, the display panel DP may further include an encapsulation layer disposed on the light emitting element OLED. The encapsulation layer may include at least one of an inorganic layer and an organic layer and may protect the light emitting element OLED from moisture, oxygen, and a foreign substance such as dust particles.

Figure 4A:
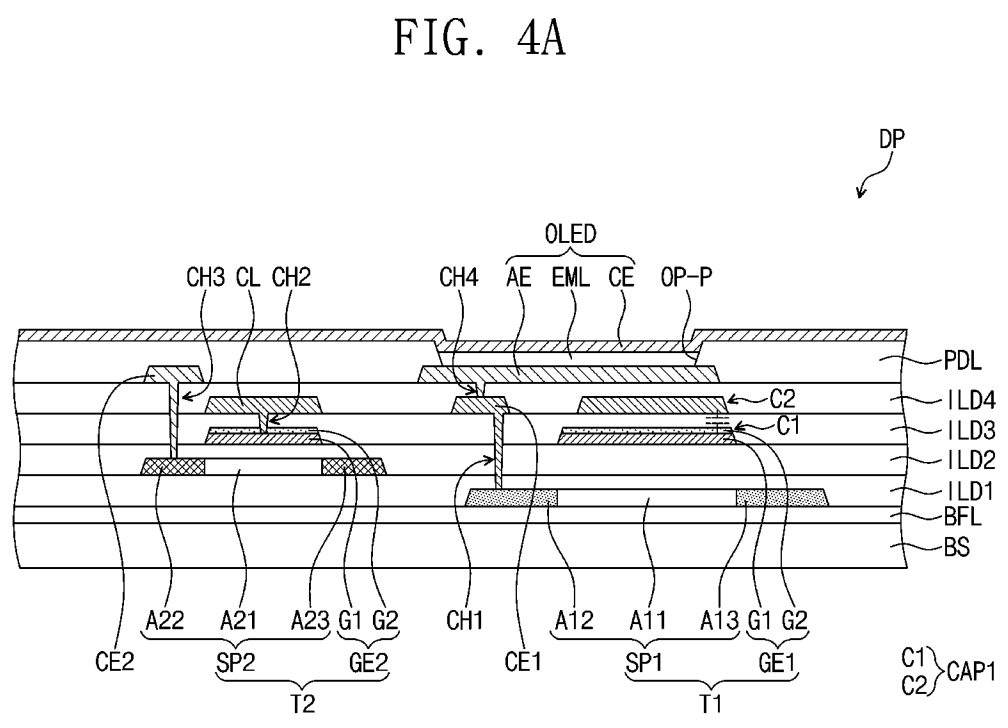
Figure 4B:
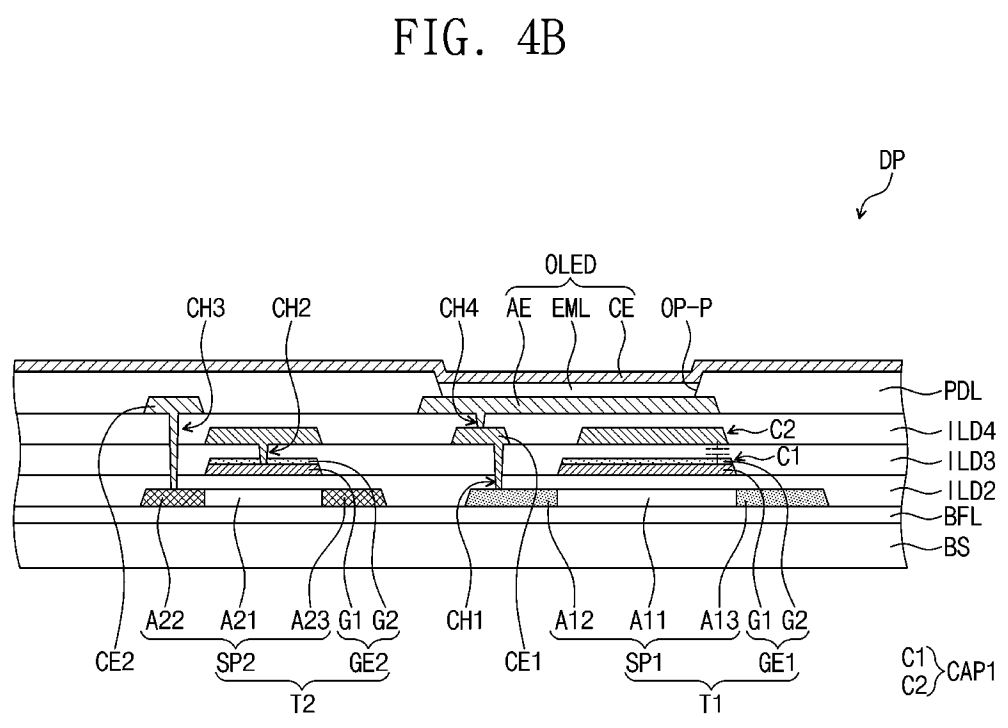

FIGS. 4A and 4B are schematic cross-sectional views of display panels DP according to embodiments. The display panels DP shown in FIGS. 4A and 4B may have substantially the same configurations as those of the display panels DP shown in FIGS. 3A and 3B except stacking positions of some components.

Referring to FIGS. 4A and 4B, the display panels DP may include a base substrate BS, insulating layers ILD1 to ILD4, a first transistor T1, a second transistor T2, a first capacitor CAP1, and a light emitting element OLED.

Referring to FIG. 4A, a first semiconductor pattern SP1 may be disposed on a layer different from a layer on which the second semiconductor pattern SP2 is disposed. The first semiconductor pattern SP1 may be disposed on the buffer layer BFL and may be covered or overlapped by a first insulating layer ILD1. The second semiconductor pattern SP2 may be disposed on the first insulating layer ILD1. Accordingly, the second semiconductor pattern SP2 may be disposed at an upper position compares with the first semiconductor pattern SP1.

However, they should not be limited thereto or thereby, and the first insulating layer ILD1 may be omitted as shown in FIG. 4B. For example, the first semiconductor pattern SP1 and the second semiconductor pattern SP2 may be disposed on a same layer. The first semiconductor pattern SP1 and the second semiconductor pattern SP2 may be disposed on a buffer layer BFL, and a second insulating layer ILD2 may be in contact with the buffer layer BLF and may cover or overlap the first semiconductor pattern SP1 and the second semiconductor pattern SP2.

As the first semiconductor pattern SP1 and the second semiconductor pattern SP2 are disposed on a same layer, an insulating layer disposed between the semiconductor patterns may be omitted, and thus, the number of insulating layers disposed on the base substrate BS may be reduced. Accordingly, a thickness of the display panel DP may decrease, a degree of integration of the pixels may increase, and thus a manufacturing process of the display panel DP may be simplified.

Although not shown in figures, the display panel DP may further include a blocking layer disposed between the buffer layer BFL and the base substrate BS. The blocking layer may be disposed to overlap the first semiconductor pattern SP1 of the first transistor T1 and the second semiconductor pattern SP2 of the second transistor T2. The blocking layer having an integral shape may overlap the first semiconductor pattern SP1 and the second semiconductor pattern SP2, however, it should not be limited thereto or thereby. The blocking layer may include blocking portions spaced apart from each other on a same layer, one blocking portion may overlap the first semiconductor pattern SP1, and the other blocking portion may overlap the second semiconductor pattern SP2. The blocking layer may prevent the semiconductor patterns SP1 and SP2 from being damaged due to the external light. It is to be understood that the shapes disclosed herein may also include shapes substantial to the shapes disclosed herein.

Referring to FIGS. 4A and 4B, a first gate electrode GE1 and a second gate electrode GE2 may be formed through a same process and may be disposed on a same layer. The first gate electrode GE1 and the second gate electrode GE2 may be disposed on the second insulating layer ILD2. The first gate electrode GE1 and the second gate electrode GE2 may be formed through a same process using one mask. Accordingly, a process of forming the first gate electrode GE1 and the second gate electrode GE2 may be simplified.

The first gate electrode GE1 and the second gate electrode GE2 may include a same material or a similar material as each other. Each of the first gate electrode GE1 and the second gate electrode GE2 may include a first layer G1 and a second layer G2, which may be sequentially stacked each other in a thickness direction. The descriptions on the first layer G1 and the second layer G2 of FIGS. 3A and 3B may be applied to the first layer G1 and the second layer G2 of FIGS. 4A and 4B.

A third insulating layer ILD3 may be disposed on the second insulating layer ILD2 and may cover or overlap the first gate electrode GE1 and the second gate electrode GE2. The first connection electrode CE1 may be disposed on the third insulating layer ILD3. The first connection electrode CE1 may be connected to the first semiconductor pattern SP1 via a contact hole CH1 defined through the first to third insulating layers ILD1 to ILD3 as shown in FIG. 4A or may be connected to the first semiconductor pattern SP1 via a contact hole CH1 defined through the second and third insulating layers ILD2 and ILD3 as shown in FIG. 4B.

The display panel DP may further include a connection line CL connected to the second gate electrode GE2. The connection line CL may extend to be connected to a driving element electrically connected to the second gate electrode GE2 of the second transistor T2.

The connection line CL may be formed through a same process as and may be disposed on a same layer as the first connection electrode CE1. The connection line CL may be connected to the second gate electrode GE2 via a contact hole CH2 defined through the third insulating layer ILD3. The contact hole CH2 overlapping the connection line CL may be formed through the second layer G2 of the second gate electrode GE2. The second layer G2 of the second gate electrode GE2 may serve as a sacrificial layer to protect the first layer G1 in a process of forming the contact holes CH1 and CH2, and a portion of the second layer G2 may be removed such that a portion of the first layer G1 is exposed. Accordingly, the connection line CL may be connected to the first layer G1 of the second gate electrode GE2, which has a relatively high conductivity.

Referring to FIGS. 4A and 4B, the display panel DP may include the first capacitor CAP1. The display panel DP may include a first upper electrode C2 overlapping the first gate electrode GE1 in case that viewed in a plan view. The first gate electrode GE1 and the first upper electrode C2, which overlap each other in case that viewed in a plan view, may form the first capacitor CAP1.

In case that viewed in a cross-section, the third insulating layer ILD3 may be disposed between the electrodes C1 and C2 forming the first capacitor CAP1. Accordingly, a capacity and an efficiency of the first capacitor CAP1 may be affected by a material, a thickness, and a dielectric permittivity of the third insulating layer ILD3. The first capacitor CAP1 having a required capacitance may be formed by adjusting the material and the thickness of the third insulating layer ILD3.

An inorganic layer included in the third insulating layer ILD3 may have a dielectric permittivity. As an example, the third insulating layer ILD3 may include silicon nitride ($SiN_x$) and silicon oxide ($SiO_x$), silicon nitride ($SiN_x$) may have the dielectric permittivity equal to or greater than about 6 and equal to or smaller than about 8, and silicon oxide ($SiO_x$) may have the dielectric permittivity equal to or greater than about 3.8 and equal to or smaller than about 5.

The third insulating layer ILD3 may have a thickness. As an example, the thickness of the third insulating layer ILD3 may be equal to or greater than about 1000 angstroms and equal to or smaller than about 10000 angstroms. The third insulating layer ILD3 may include the inorganic layers, and the capacitance of the first capacitor CAP1 may be changed depending on the thickness of each of the inorganic layers included in the third insulating layer ILD3. As an example, the third insulating layer ILD3 may include at least one silicon nitride ($SiN_x$) layer and at least one silicon oxide ($SiO_x$) layer, and a sum of thicknesses of silicon nitride ($SiN_x$) layers forming the third insulating layer ILD3 may be equal to or greater than one times and equal to or smaller than about twenty times a sum of thicknesses of silicon oxide ($SiO_x$) layers forming the third insulating layer ILD3. However, the third insulating layer ILD3 should not be limited thereto or thereby.

The display panel DP shown in FIGS. 4A and 4B may include a relatively small number of capacitors compared with the display panel DP shown in FIGS. 3A and 3B. Accordingly, the number of masks required to manufacture the display panel DP may be reduced, and the stacking process of the display panel DP may be simplified.

A fourth insulating layer ILD4 may be disposed on the third insulating layer ILD3 and may cover or overlap the first upper electrode C2 and the first connection electrode CE1. The fourth insulating layer ILD4 may include an organic layer, and may provide a flat upper surface thereon on which the light emitting element OLED is disposed. The fourth insulating layer ILD4 may include a single insulating layer.

The pixel electrode AE of the light emitting element OLED may be connected to the first connection electrode CE1 via a contact hole CH4 defined through the fourth insulating layer ILD4. Descriptions of the light emitting element OLED are the same as the details described above.

A second connection electrode CE2 may be disposed on a layer different from the second semiconductor pattern SP2 and may be connected to the second semiconductor pattern SP2. The second connection electrode CE2 may be disposed on a layer different from the first connection electrode CE1. According to an embodiment, the second connection electrode CE2 may be disposed on a same layer as the pixel electrode AE. The second connection electrode CE2 may be disposed on the fourth insulating layer ILD4 providing the flat upper surface. The second connection electrode CE2 may be connected to the second semiconductor pattern SP2 via a contact hole CH3 defined through the second to fourth insulating layers ILD2 to ILD4.

The second connection electrode CE2 may be formed through a same process as the pixel electrode AE and may be disposed on a same layer as the pixel electrode AE. The second connection electrode CE2 may include a same material or a similar material as that of the pixel electrode AE. The contact hole CH3 used to connect the second connection electrode CE2 and the second semiconductor pattern SP2 and the contact hole CH4 used to connect the first connection electrode CE1 and the pixel electrode AE may be formed through a same process using one mask. The second connection electrode CE2 and the pixel electrode AE may be formed through a same process using one mask. Accordingly, the second connection electrode CE2 may be formed without employing an additional mask, and the manufacturing process of the second connection electrode CE2 may be simplified. The number of the insulating layers disposed between the base substrate BS and the light emitting element OLED may be reduced.

Figure 5A:
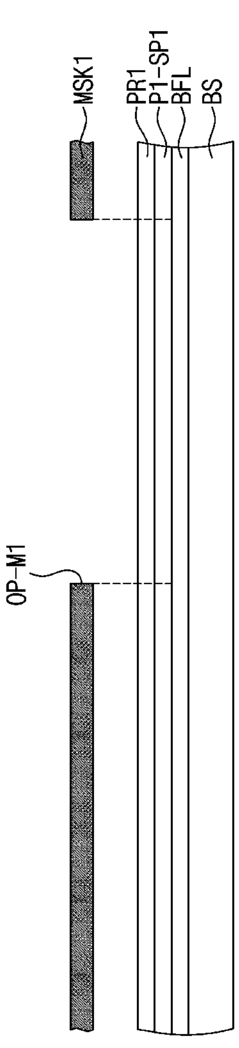
FIGS. 5A to 5P are schematic cross-sectional views of a method of manufacturing a display panel according to an embodiment.

FIGS. 5A to 5P are schematic cross-sectional views of a method of manufacturing the display panel DP according to an embodiment. The display panel DP manufactured through processes shown in FIGS. 5A to 5P may correspond to the display panel DP shown in FIG. 3A.

Figure 5B:
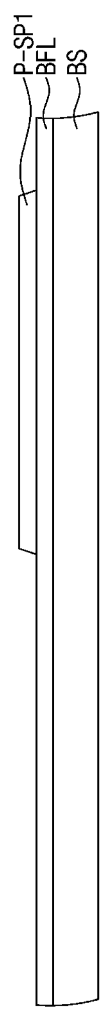
Figure 5C:
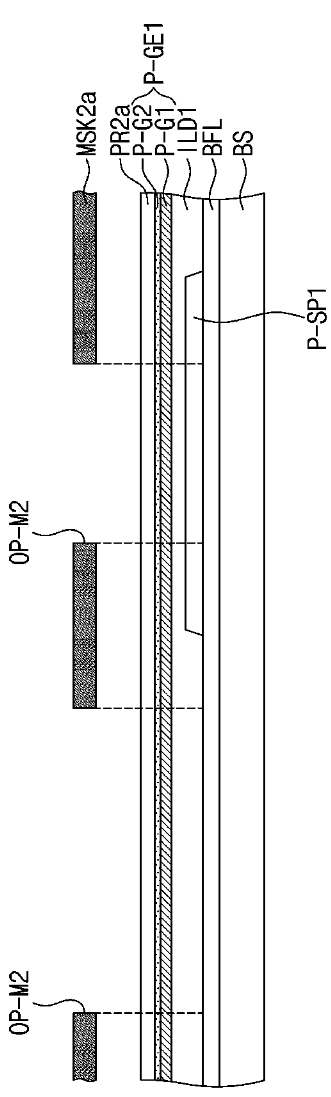
Figure 5D:
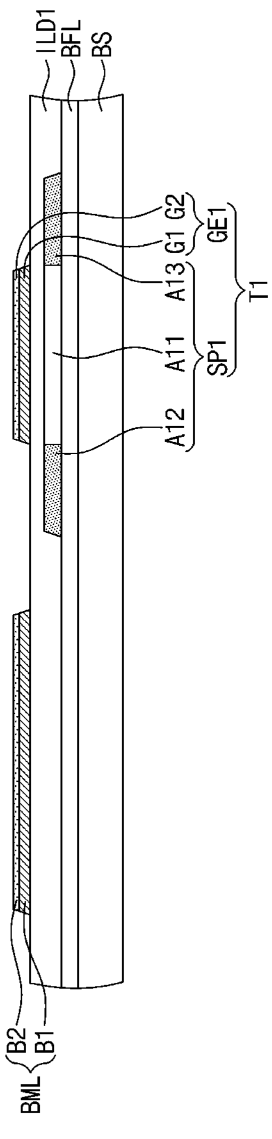

Referring to FIG. 5A, a first preliminary semiconductor layer P1-SP1 may be disposed on the buffer layer BFL to form the first semiconductor pattern SP1 (refer to FIG. 5D). According to an embodiment, the first preliminary semiconductor layer P1-SP1 may include a silicon semiconductor material. After the first preliminary semiconductor layer P1-SP1 is formed, a first photoresist layer PR1 may be formed on the first preliminary semiconductor layer P1-SP1.

A first mask MSK1, which is provided with a first opening OP-M1 defined therethrough to correspond to the area in which the first semiconductor pattern SP1 (refer to FIG. 5D) is formed, may be provided above the first photoresist layer PR1 to pattern the first preliminary semiconductor layer P1-SP1. An exposure process providing a light to the first mask MSK1 may be performed, and the light may be irradiated onto portions of the first photoresist layer PR1 and the first preliminary semiconductor layer P1-SP1, which correspond to the first opening OP-M1.

The portion of the first photoresist layer PR1, which overlaps the first opening OP-M1, may remain, and the other portion of the first photoresist layer PR1, which does overlap the first mask MSK1 and does not receive the light, may be removed by a developing solution provided in a development process. Accordingly, a portion of the first preliminary semiconductor layer P1-SP1 may be exposed by the first photoresist layer PR1 from which the portion is removed corresponding to the first mask MSK1, and the portion of the first preliminary semiconductor layer P1-SP1, which is exposed from a remaining first photoresist layer PR1, may be removed by the etching process. The remaining first photoresist layer PR1 may be removed such that the first preliminary semiconductor layer P1-SP1 is patterned to correspond to the first opening OP-M1.

In an embodiment, a negative photo process in which the portion corresponding to the opening of the mask remains as the pattern is described as a representative example, however, the disclosure should not be limited thereto or thereby. According to an embodiment, a first preliminary semiconductor pattern P-SP1 may be formed by a positive photo process in which the portion corresponding to the opening of the mask is removed. The photo processes described hereinafter means the negative photo process, however, at least one of the photo processes described hereinafter may be performed by the positive photo process.

FIG. 5B shows the first preliminary semiconductor layer patterned by the process of FIG. 5A, and the patterned first preliminary semiconductor layer may be defined as the first preliminary semiconductor pattern P-SP1. The first preliminary semiconductor pattern P-SP1 may correspond to the semiconductor pattern on which a doping process is not performed. The first preliminary semiconductor pattern P-SP1 may correspond to the first opening OP-M1 (refer to FIG. 5A) of the first mask MSK1 (refer to FIG. 5A).

Referring to FIG. 5C, the first insulating layer ILD1 may be disposed on the first preliminary semiconductor pattern P-SP1. A first preliminary gate electrode layer P-GE1 may be deposited on the first insulating layer ILD1 to form the first gate electrode GE1 (refer to FIG. 5D).

The first preliminary gate electrode layer P-GE1 may include the first layer P-G1 including the conductive material and the second layer P-G2 deposited on the first layer P-G1 and protecting the first layer P-G1. The second layer P-G2 may include titanium nitride ($TiN_x$). The thickness of the second layer P-G2 may be smaller than the thickness of the first layer P-G1.

A second photoresist layer PR2*a* may be coated on the first preliminary gate electrode layer P-GE1. A second mask MSK2*a* through which second openings OP-M2 are defined may be disposed above the second photoresist layer PR2*a* to pattern the first preliminary gate electrode layer P-GE1. At least a portion of the second openings OP-M2 may overlap the first preliminary semiconductor pattern P-SP1, and this may correspond to an area defined as the active area A11 (refer to FIG. 5D).

In the process of forming the first gate electrode GE1 (refer to FIG. 5D), the blocking layer BML (refer to FIG. 5D) may be simultaneously formed with the first gate electrode GE1 using the second mask MSK2*a*. Accordingly, a portion of the second openings OP-M2 may correspond to an area in which the blocking layer BML (refer to FIG. 5D) is formed. The first conductive pattern having the pattern corresponding to the second openings OP-M2 may be formed through the exposure, development, and etching processes.

Referring to FIG. 5D, a portion of the first conductive pattern may be formed as the first gate electrode GE1, and the other portion of the first conductive pattern may be formed as the blocking layer BML. After the first gate electrode GE1 is formed, the first preliminary semiconductor pattern P-SP1 may be doped using the first gate electrode GE1 as a mask, and the first semiconductor pattern SP1 including the conductive areas A12 and A13 and the active area A11 may be formed by the doping process. The first semiconductor pattern SP1 and the first gate electrode GE1 may be defined as the first transistor T1.

Figure 5E:
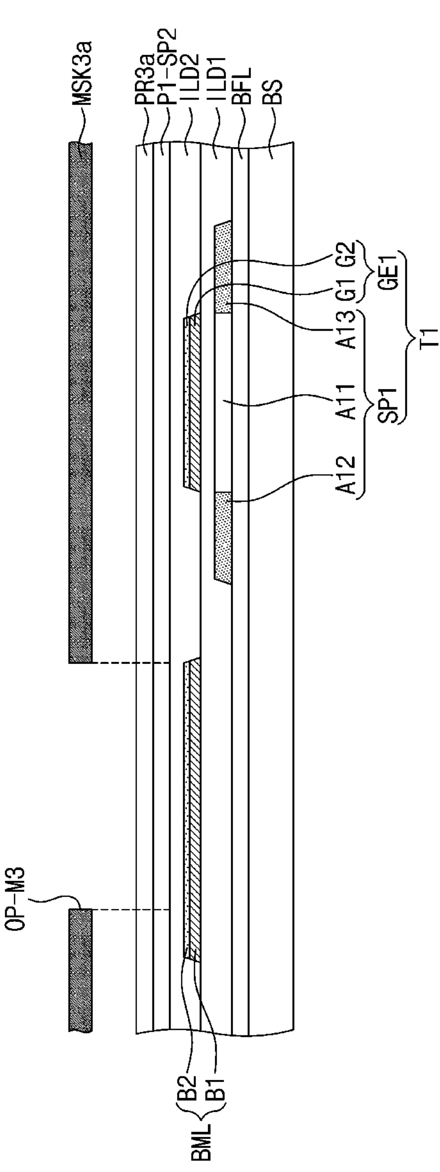

Referring to FIG. 5E, the second insulating layer ILD2 may be deposited on the first gate electrode GE1 and the blocking layer BML. A second preliminary semiconductor layer P1-SP2 and a third photoresist layer PR3*a* may be formed on the second insulating layer ILD2 to form a second preliminary semiconductor pattern P-SP2 (refer to FIG. 5F).

The second preliminary semiconductor layer P1-SP2 may include an oxide semiconductor material. According to an embodiment, the second preliminary semiconductor layer P1-SP2 may include the oxide semiconductor material and a transparent conductive material having amorphous crystalline structure.

Figure 5F:
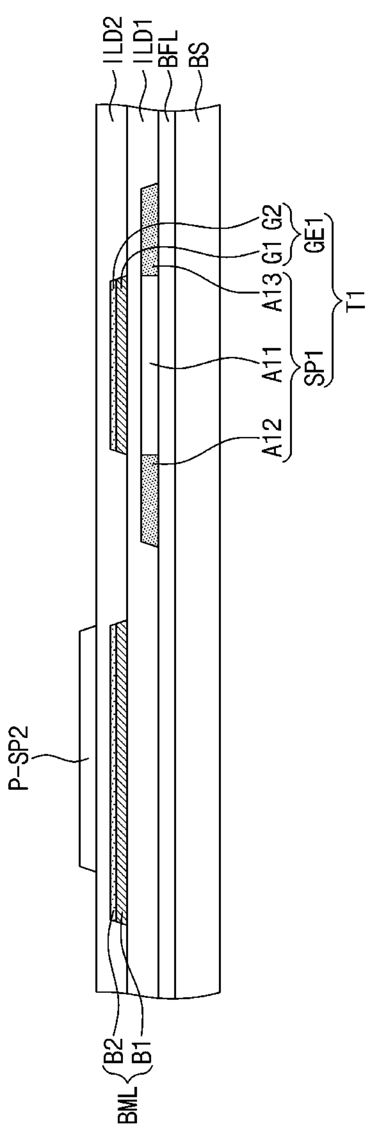

A third mask MSK3*a* through which a third opening OP-M3 is defined may be disposed above the third photoresist layer PR3*a* to pattern the second preliminary semiconductor layer P1-SP2. The third opening OP-M3 may correspond to an area in which the second preliminary semiconductor pattern P-SP2 is formed. The second preliminary semiconductor pattern P-SP2 corresponding to the third openings OP-M3 through exposure, development, and etching processes as shown in FIG. 5F. The second preliminary semiconductor pattern P-SP2 may correspond to the semiconductor pattern on which the doping process is not performed.

Figure 5G:
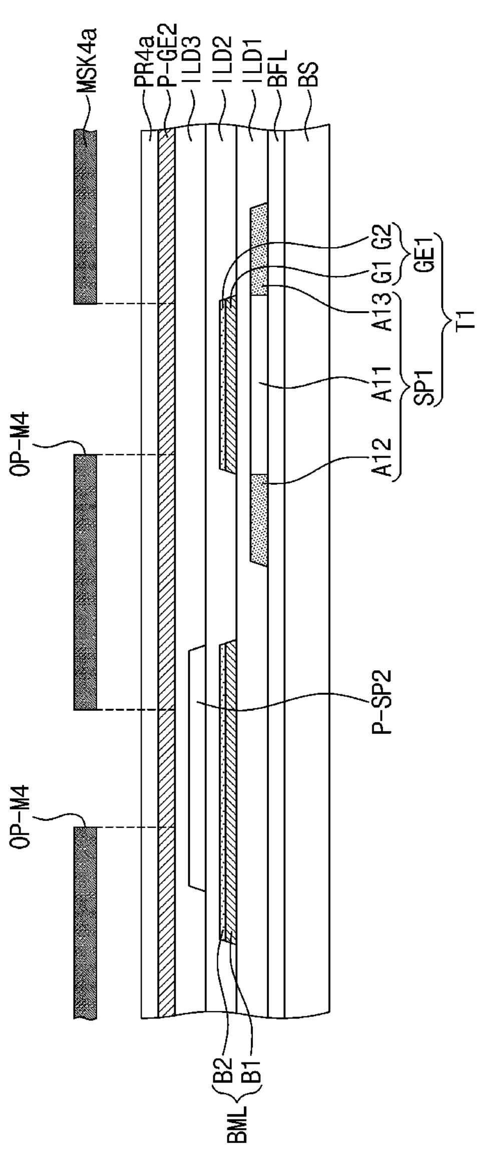

Referring to FIG. 5G, the third insulating layer ILD3 may be deposited on the second preliminary semiconductor pattern P-SP2. A second preliminary gate electrode layer P-GE2 and a fourth photoresist layer PR4*a* may be formed on the third insulating layer ILD3 to form the second gate electrode GE2 (refer to FIG. 5H).

A fourth mask MSK4*a* through which fourth openings OP-M4 are defined may be disposed above the fourth photoresist layer PR4*a* to pattern the second preliminary semiconductor pattern P-SP2. At least a portion of the fourth openings OP-M4 may overlap the second preliminary semiconductor pattern P-SP2, and this may correspond to an area defined as the active area A21 (refer to FIG. 5H) formed later.

In the process of forming the second gate electrode GE2 (refer to FIG. 5H), the first upper electrode C2 (refer to FIG. 5H) may be simultaneously formed with the second gate electrode GE (refer to FIG. 5H) using the fourth mask MSK4*a*. Accordingly, a portion of the fourth openings OP-M4 may correspond to an area in which the first upper electrode C2 (refer to FIG. 5H) is formed. According to an embodiment, the portion of the fourth openings OP-M4 may overlap the first gate electrode GE1 in case that viewed in a plan view. A second conductive pattern having the pattern corresponding to the fourth openings OP-M4 through exposure, development, and etching processes.

Figure 5H:
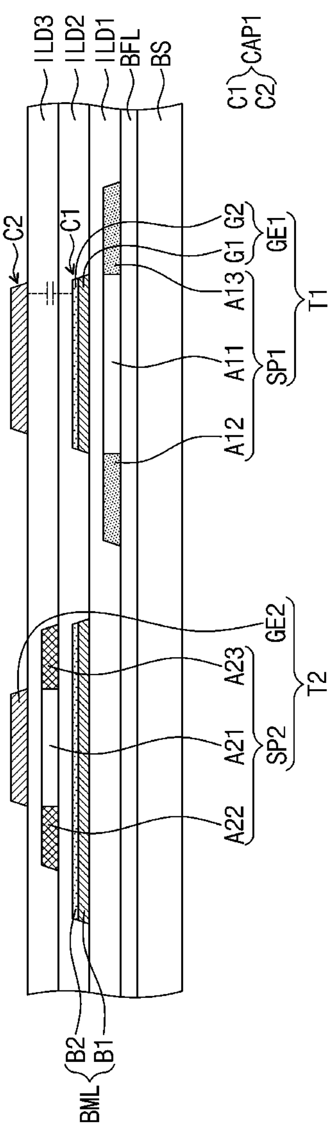

Referring to FIG. 5H, a portion of the second conductive pattern may be formed as the second gate electrode GE2, and the other portion of the second conductive pattern may be formed as the first upper electrode C2. The second preliminary semiconductor pattern P-SP2 may be doped using the second gate electrode GE2 as a mask, and the second semiconductor pattern SP2 having the conductive areas A22 and A23 and the active area A21 may be formed by the doping process. The second semiconductor pattern SP2 and the second gate electrode GE2 may be defined as the second transistor T2.

The first gate electrode GE1 and the first upper electrode C2 at least partially overlapping the first gate electrode GE1 in a plan view may form the first capacitor CAP1. As the first upper electrode C2 is formed through a same process as the second gate electrode GE2, the first capacitor CAP1 may be formed without increasing the number of the masks.

Figure 5I:
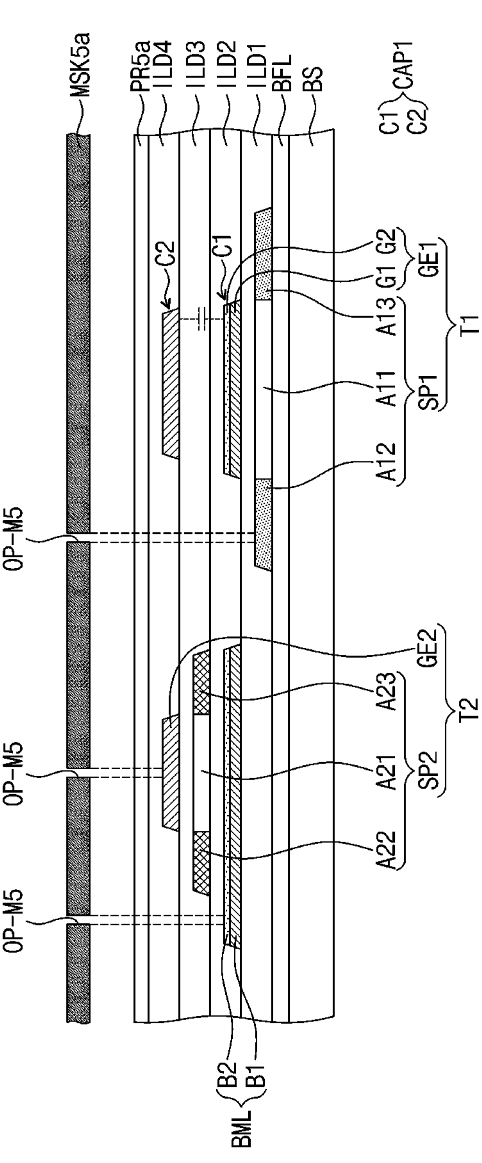

Referring to FIG. 5I, the fourth insulating layer ILD4 may be deposited on the second gate electrode GE2 and the first upper electrode C2. A fifth photoresist layer PR5*a* may be coated on the fourth insulating layer ILD4 to form a contact hole overlapping the first semiconductor pattern SP1.

A fifth mask MSK5*a* through which fifth openings OP-M5 are defined may be disposed above the photoresist layer PR5*a*. A portion of the fifth openings OP-M5 may overlap the first semiconductor pattern SP1, and another portion of the fifth openings OP-M5 may overlap the blocking layer BML, and the other portion of the fifth openings OP-M5 may overlap the second gate electrode GE2. For example, contact holes CH1, CH2-1, and CH2-2 (refer to FIG. 5J) corresponding to the semiconductor pattern SP1, the blocking layer BML, and the second gate electrode GE2 may be formed using one fifth mask MSK5*a*.

Figure 5J:
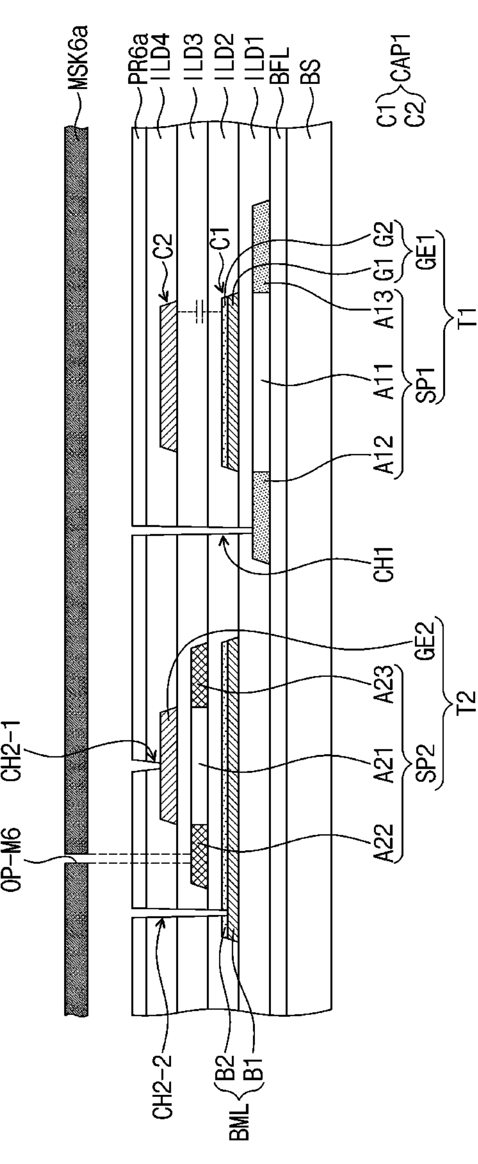

Referring to FIG. 5J, the contact hole CH1 exposing the portion of the first semiconductor pattern SP1 and defined through the first to fourth insulating layers ILD1 to ILD4 may be formed through the photo process using the fifth mask MSK5*a*. In the process of forming the contact hole CH1 through which the portion of the first semiconductor pattern SP1 is exposed, a phenomenon in which a portion of an upper part of the first semiconductor pattern SP1 is oxidized may occur. Accordingly, a buffered oxide etch (BOE) process may be performed to remove the oxidized portion of the upper part of the first semiconductor pattern SP1 as a subsequent process. The first gate electrode GE1 and the blocking layer BML may be affected during the BOE process. However, as the first gate electrode GE1 and the blocking layer BML include the second layers G2 and B2 containing titanium nitride ($TiN_x$), respectively, the second layers G2 and B2 may serve as a sacrificial layer and may be etched instead of the first gate electrode GE1 and the blocking layer BML. Accordingly, the contact hole CH2-2 overlapping the blocking layer BML may be formed through the second layer B2 of the blocking layer BML. Accordingly, the first layers G1 and B1 of the first gate electrode GE1 and the blocking layer BML may be protected.

After the contact hole CH1 through which the portion of the first semiconductor pattern SP1 is exposed is formed, the contact hole CH3 (refer to FIG. 5K) may be formed using another mask to expose the portion of the second semiconductor pattern SP2. The process of forming the contact hole CH1 through which the portion of the first semiconductor pattern SP1 is exposed and the process of forming the contact hole CH3 (refer to FIG. 5K) through which the portion of the second semiconductor pattern SP2 is exposed may be performed under different etching conditions, and thus, they may be performed through separate processes using separate masks.

A sixth mask MSK6*a* through which a sixth opening OP-M6 is defined may be disposed above a sixth photoresist layer PR6*a* disposed on the fourth insulating layer ILD4. The sixth opening OP-M6 may overlap the second semiconductor pattern SP2.

Figure 5K:
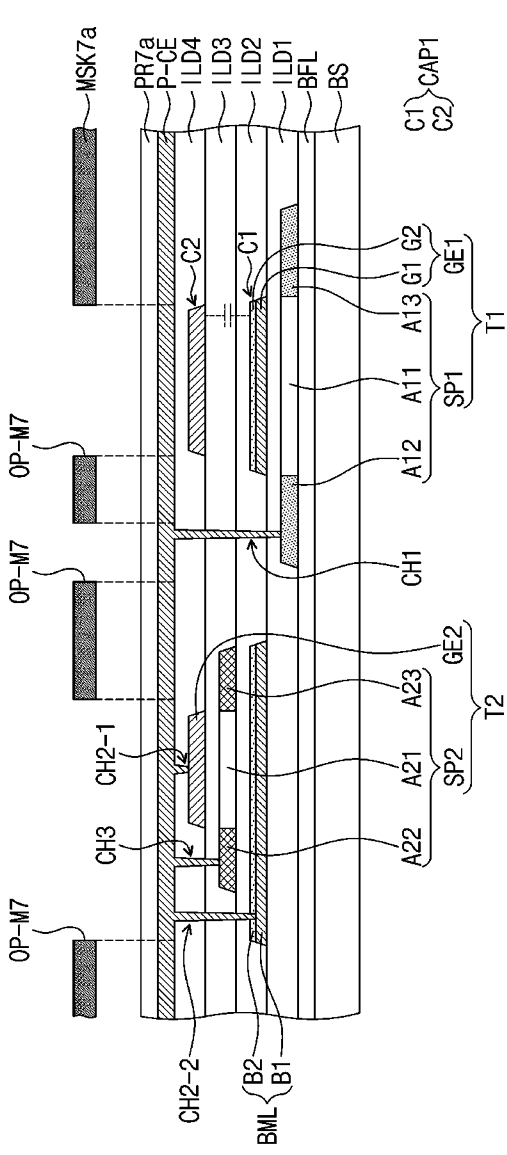

Referring to FIG. 5K, a preliminary connection electrode layer P-CE and a seventh photoresist layer PR7*a* may be formed on the fourth insulating layer ILD4. A seventh mask MSK7*a* through which seventh openings OP-M7 are defined may be provided to pattern the preliminary connection electrode layer P-CE. The seventh openings OP-M7 may overlap the contact holes CH1, CH2-1, CH2-2, and CH3 in case that viewed in a plan view. A portion of the seventh openings OP-M7 may correspond to an area in which the first connection electrode CE1 (refer to FIG. 5L) is formed, and the other portion of the seventh openings OP-M7 may correspond to an area in which the second connection electrode CE2 (refer to FIG. 5L) is formed.

Figure 5L:
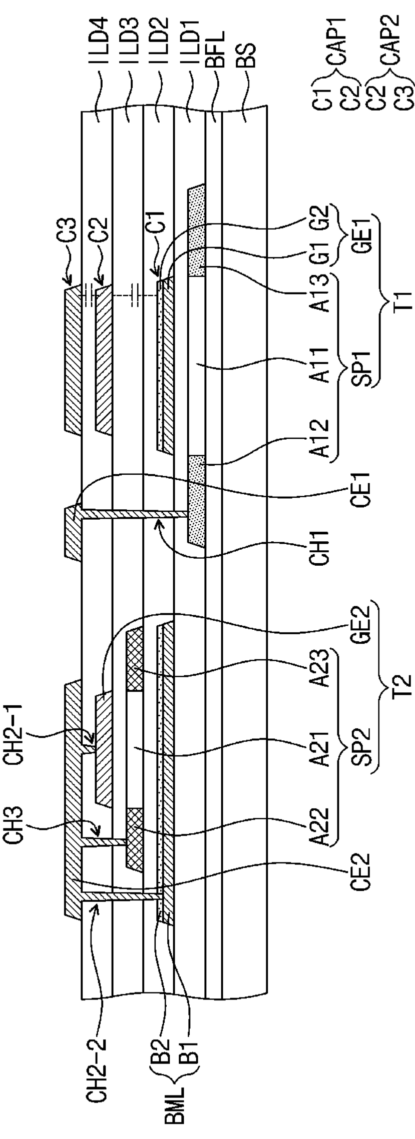

Referring to FIG. 5L, the first connection electrode CE1 connected to the first semiconductor pattern SP1 and the second connection electrode CE2 connected to the second semiconductor pattern SP2 may be simultaneously formed by patterning the preliminary connection electrode layer P-CE using the seventh mask MSK7*a*. The second upper electrode C3 overlapping the first upper electrode C2 may be formed in the process of forming the first connection electrode CE1.

The first upper electrode C2 and the second upper electrode C3 at least partially overlapping the first upper electrode C2 in a plan view may form the second capacitor CAP2. As the second upper electrode C3 is formed through a same process as the first and second connection electrodes CE1 and CE2, the second capacitor CAP2 may be formed without increasing the number of the masks.

Figure 5M:
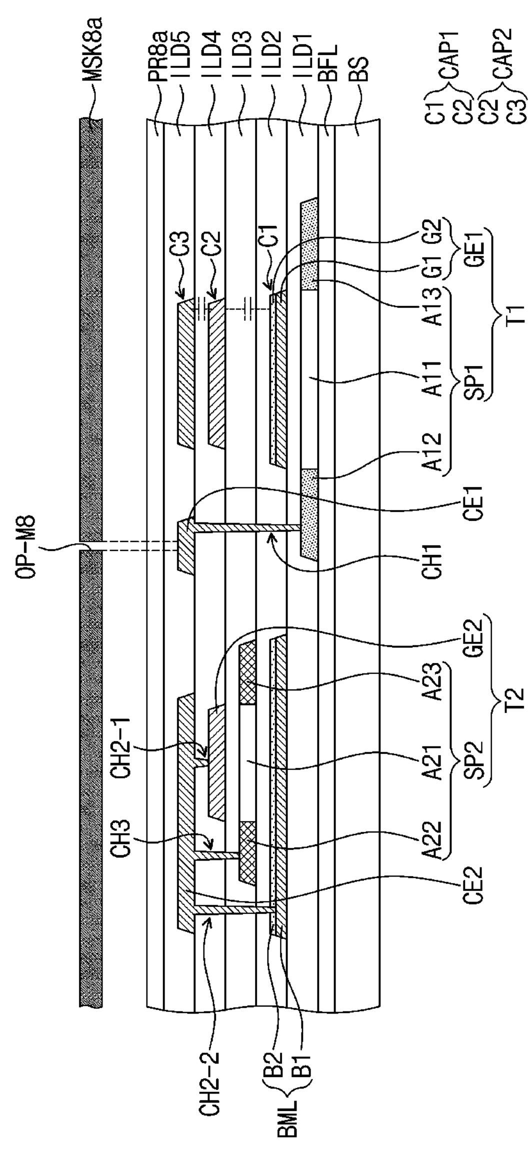
Figure 5N:
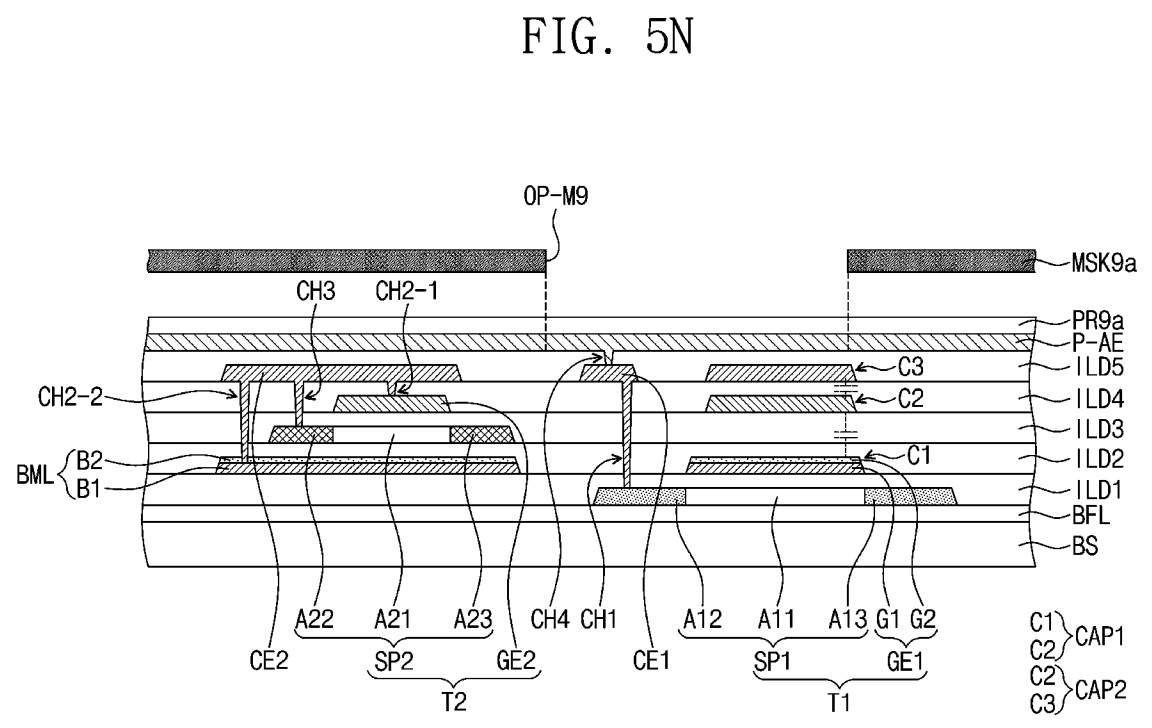
Figure 50:
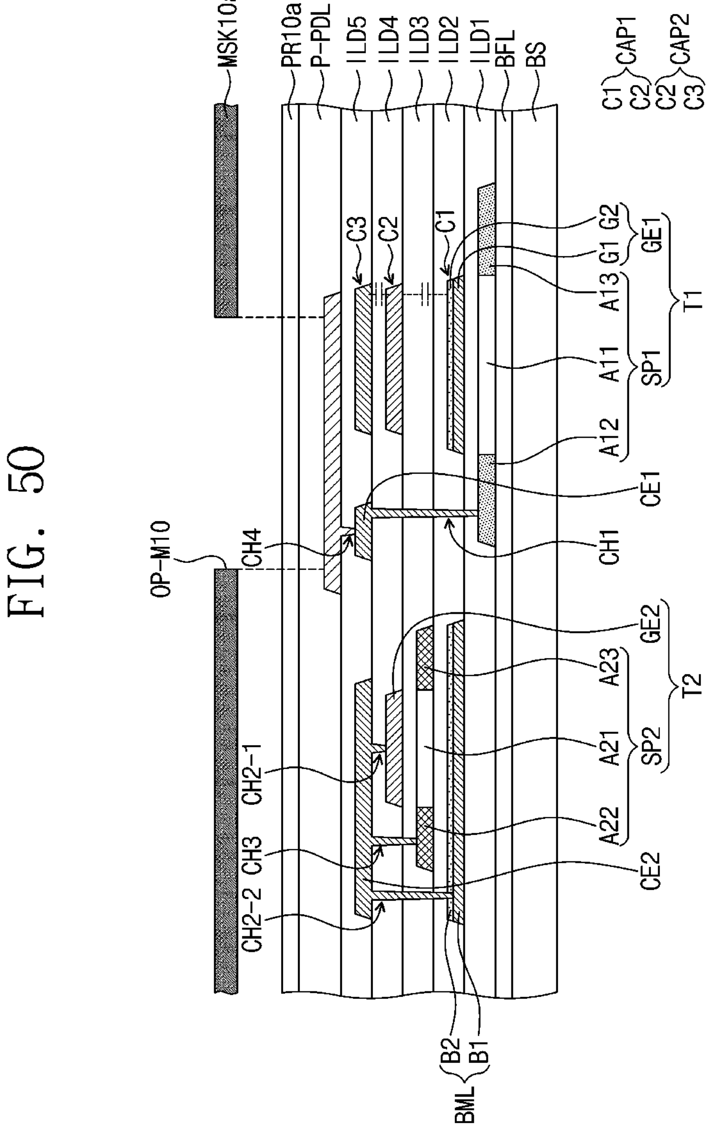

Referring to FIG. 5M, the fifth insulating layer ILD5 may be deposited on the first and second connection electrodes CE1 and CE2. According to an embodiment, the fifth insulating layer ILD5 may be formed as the single organic layer, however, it should not be limited thereto or thereby. An eighth photoresist layer PR8*a* may be coated on the fifth insulating layer ILD5, and, an eighth mask MSK8*a*, which is provided with an eighth opening OP-M8 defined therethrough to correspond to an area in which a contact hole CH4 (refer to FIG. 5N) is formed, may be disposed above the eighth photoresist layer PR8*a* to form the contact hole CH4 (refer to FIG. 5N) through the fifth insulating layer ILD5.

Referring to FIG. 5N, after the contact hole CH4 defined through the fifth insulating layer ILD5 and exposing the portion of the first connection electrode CE1 is formed, a preliminary pixel electrode layer P-AE and a ninth photoresist layer PR9*a* may be formed on the fifth insulating layer ILD5. A ninth mask MSK9*a*, which is provided with a ninth opening OP-M9 defined therethrough to correspond to an area in which the pixel electrode AE (refer to FIG. 5O) is formed, may be disposed above the ninth photoresist layer PR9*a*. The pixel electrode AE connected to the first connection electrode CE1 may be formed through exposure, development, and etching processes as shown in FIG. 5O.

Referring to FIG. 5O, a preliminary pixel definition layer P-PDL and a tenth photoresist layer PR10*a* may be disposed on the pixel electrode AE and the fifth insulating layer ILD5 to form the pixel definition layer PDL (refer to FIG. 5P). A tenth mask MSK10*a* through which a tenth opening OP-M10 is defined may be disposed above the tenth photoresist layer PR10*a* to pattern the preliminary pixel definition layer P-PDL. The tenth opening OP-M10 may correspond to an area in which the light emitting opening OP-P (refer to FIG. 5P) is defined. The light emitting opening OP-P exposing at least a portion of the pixel electrode AE and defined through the pixel definition layer PDL may be formed through exposure, development, and etching processes as shown in FIG. 5P.

Although not shown in figures, the display panel DP of FIG. 3A may be formed through the processes of forming the light emitting layer EML and the opposite electrode CE on the pixel electrode AE.

FIGS. 6A to 6M are schematic cross-sectional views of a method of manufacturing the display panel DP according to an embodiment. The display panel DP manufactured through processes shown in FIGS. 6A to 6M may correspond to the display panel DP shown in FIG. 4B.

Figure 6A:
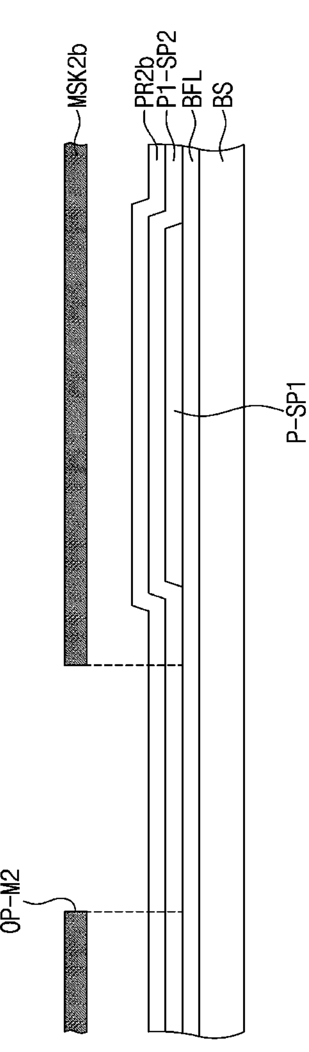

Referring to FIG. 6A, a first preliminary semiconductor pattern P-SP1 may be formed on a buffer layer BFL through same processes as those shown in FIGS. 5A and 5B. A second preliminary semiconductor pattern layer P1-SP2 may be formed on the buffer layer BFL. A portion of the second preliminary semiconductor pattern layer P1-SP2 may overlap the first preliminary semiconductor pattern P-SP1 in case that viewed in a plan view.

Figure 6B:
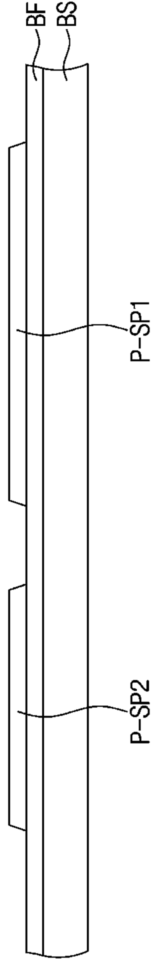

After the second preliminary semiconductor layer P1-SP2 is formed, A second photoresist layer PR2*b* may be coated on the second preliminary semiconductor layer P1-SP2. A second mask MSK2*b*, which is provided with a second opening OP-M2 defined therethrough to correspond to an area in which a second preliminary semiconductor pattern P-SP2 (refer to FIG. 6B) is formed, may be disposed above the second photoresist layer PR2*b* to pattern the second preliminary semiconductor layer P1-SP2. The second preliminary semiconductor pattern P-SP2 may be formed through exposure, development, and etching processes. Referring to FIG. 6B, the first preliminary semiconductor pattern P-SP1 and the second preliminary semiconductor pattern P-SP2 may be formed on a same layer.

Figure 6C:
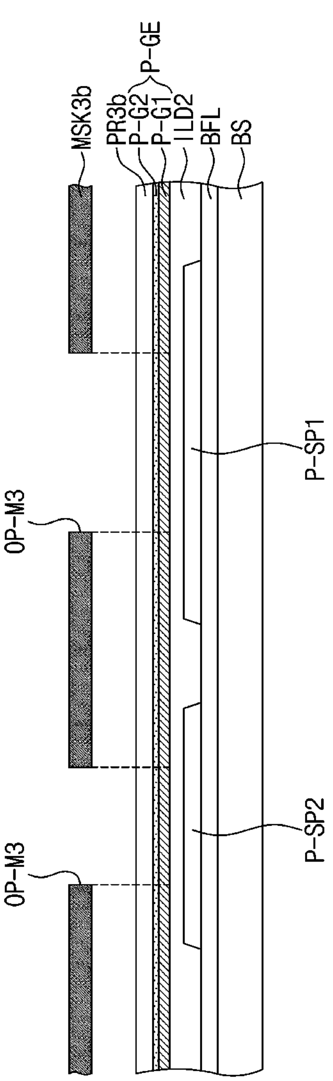
Figure 6D:
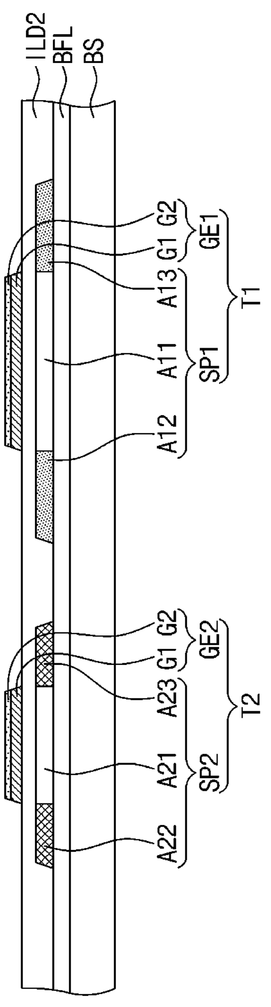

Referring to FIGS. 6C and 6D, the second insulating layer ILD2 may be coated on the first preliminary semiconductor pattern P-SP1 and the second preliminary semiconductor pattern P-SP2. As the first preliminary semiconductor pattern P-SP1 and the second preliminary semiconductor pattern P-SP2 are formed on a same layer, a process of forming the first insulating layer ILD1 of FIG. 4A may be omitted.

A preliminary gate electrode layer P-GE and a third photoresist layer PR3*b* may be formed on the second insulating layer ILD2. Descriptions of the preliminary gate electrode layer P-GE are the same as the descriptions on the first preliminary gate electrode layer P-GE1 (refer to FIG. 5C).

A third mask MSK3*b* through which third openings OP-M3 are defined may be disposed above the third photoresist layer PR3*b* to pattern the preliminary gate electrode layer P-GE. A portion of the third openings OP-M3 may overlap the first preliminary semiconductor pattern P-SP1, and the other portion of the third openings OP-M3 may overlap the second preliminary semiconductor pattern P-SP2.

The first gate electrode GE1 of the first transistor T1 and the second gate electrode GE2 of the second transistor T2 may be simultaneously formed using a same third mask MSK3*b*. Accordingly, the first gate electrode GE1 and the second gate electrode GE2 may include a same material or a similar material and may be disposed on a same layer. As the first gate electrode GE1 and the second gate electrode GE2 may be formed through a same process, the number of masks required to form the first gate electrode GE1 and the second gate electrode GE2 may be reduced, and the process of forming the first gate electrode GE1 and the second gate electrode GE2 may be simplified.

Figure 6E:
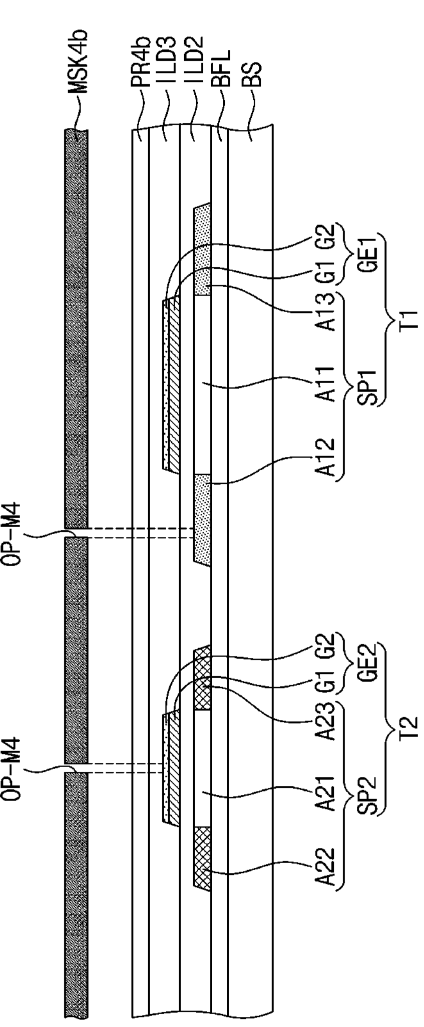
Figure 6F:
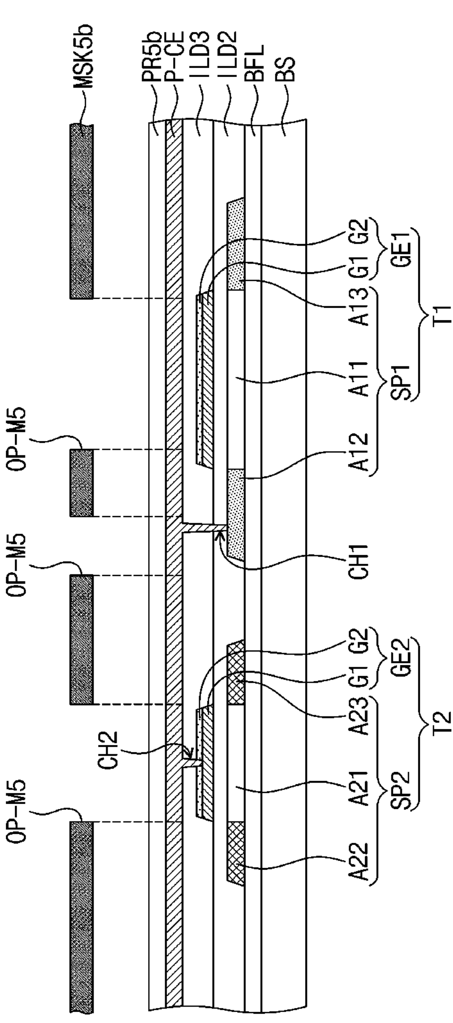

Referring to FIGS. 6E and 6F, the third insulating layer ILD3 and a fourth photoresist layer PR4*b* may be formed on the first gate electrode GE1 and the second gate electrode GE2. A fourth mask MSK4*b* through which fourth openings OP-M4 are defined may be disposed above the fourth photoresist layer PR4*b*. Contact holes CH1 and CH2 may be formed using the fourth mask MSK4*b* to expose a portion of the first semiconductor pattern SP1 and a portion of the second gate electrode GE2, respectively. As described above, the second layer G2 of the first gate electrode GE1 and the second layer G2 of the second gate electrode GE2 may serve as a sacrificial layer in the process of forming the contact holes CH1 and CH2 to protect the first layer G1 of each of the first and second gate electrodes GE1 and GE2.

After the contact holes CH1 and CH2 are formed, a preliminary connection electrode layer P-CE and a fifth photoresist layer PR5*b* may be formed on the third insulating layer ILD3. A fifth mask MSK5*b* through which fifth openings OP-M5 are defined may be disposed above the fifth photoresist layer PR5*b*.

Figure 6G:
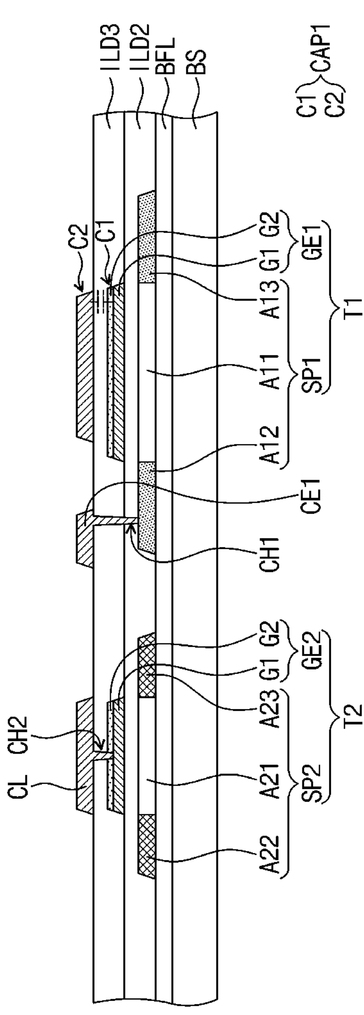

Referring to FIG. 6G, the first connection electrode CE1 and the first upper electrode C2 may be formed using the fifth mask MSK5*b*. The first gate electrode GE1 and the first upper electrode C2 at least partially overlapping the first gate electrode GE1 may form the first capacitor CAP1. Accordingly, the first capacitor CAP1 may be formed without performing a separate additional process, and the manufacturing process of the display panel DP may be simplified. A portion of the patterned preliminary connection electrode layer P-CE may be formed as the connection line CL connected to the second gate electrode GE2.

Figure 6H:
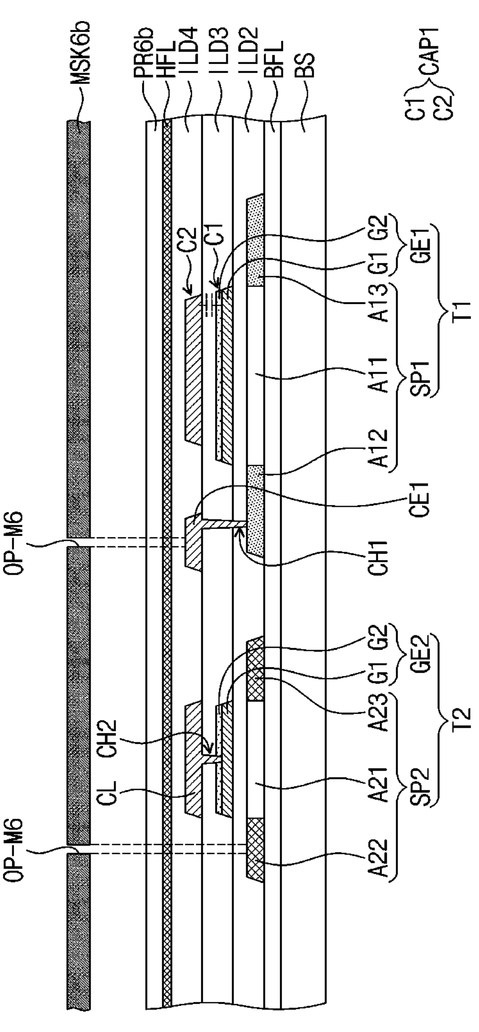
Figure 6I:
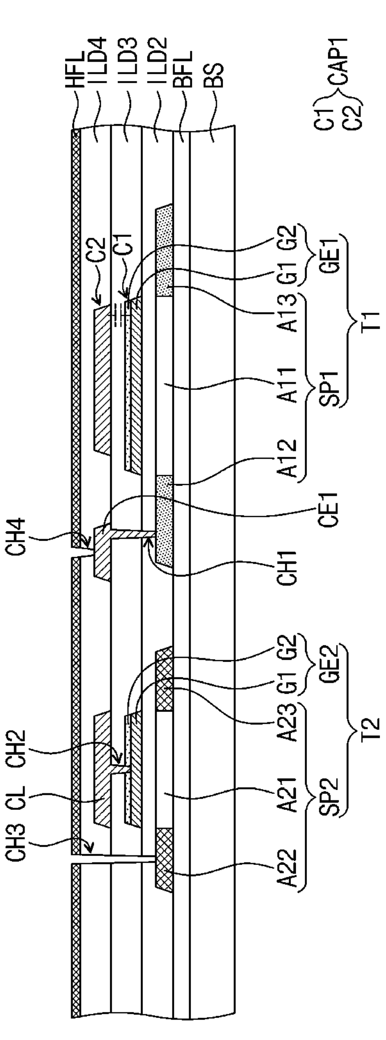

Referring to FIGS. 6H and 6I, the fourth insulating layer ILD4 may be deposited on the first connection electrode CE1 and the first upper electrode C2. According to an embodiment, the fourth insulating layer ILD4 may be formed as a single organic layer, however it should not be limited thereto or thereby. The sixth photoresist layer PR6*b* may be formed on the fourth insulating layer ILD4. A sixth mask MSK6*b* provided with a sixth opening OP-M6 corresponding to an area in which a contact hole CH4 is formed may be disposed above the sixth photoresist layer PR6*b* to form the contact hole CH4 defined through the fourth insulating layer ILD4.

According to an embodiment, in the process of forming the contact hole CH4 through which a portion of the first connection electrode CE1 is exposed, a contact hole CH3 corresponding to the second semiconductor pattern SP2 may be simultaneously formed with the contact hole CH4. The contact hole CH4 through which the portion of the first connection electrode CE1 is exposed may be formed only through the fourth insulating layer ILD4 that is the organic layer, however, the contact hole CH3 corresponding to the second semiconductor pattern SP2 is required to penetrate through the second to fourth insulating layers ILD2 to ILD4. Accordingly, in the process of forming the contact hole CH3 corresponding to the second semiconductor pattern SP2, the fourth insulating layer ILD4 that is the organic layer may be over etched or damaged. Accordingly, a hard mask layer HFL may be disposed on the fourth insulating layer ILD4 to prevent the fourth insulating layer ILD4 from being damaged in the etching process.

The hard mask layer HFL may include a material with a high selectivity compared to the second semiconductor pattern SP2. Accordingly, the hard mask layer HFL may prevent the insulating layers or the second semiconductor pattern SP2 from being over-etched.

Figure 6J:
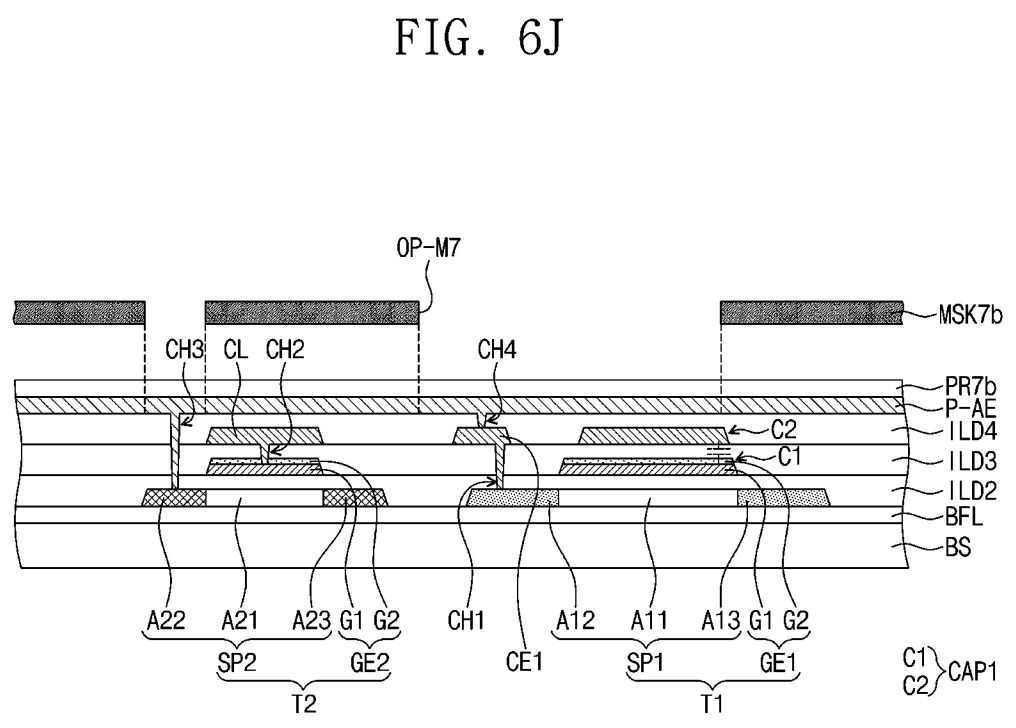
Figure 6K:
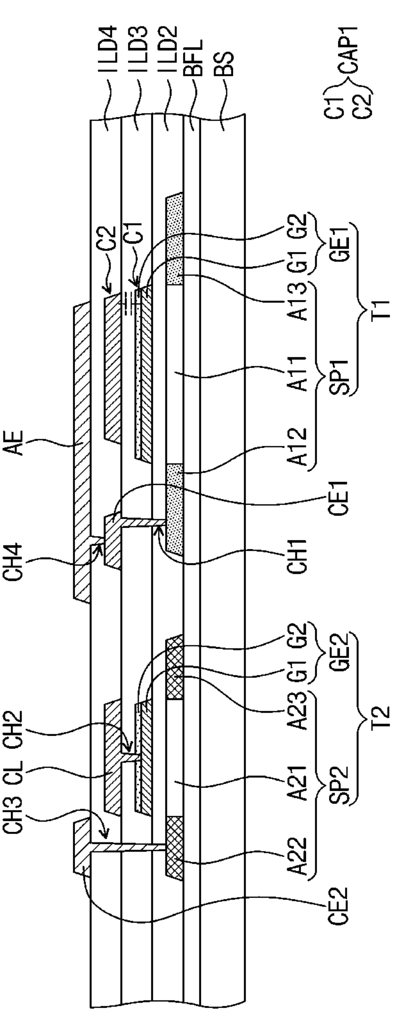

Referring to FIGS. 6J and 6K, after the contact holes CH3 and CH4 are formed through the fourth insulating layer ILD4, the hard mask layer HFL may be removed. A preliminary pixel electrode layer P-AE and a seventh photoresist layer PR7*b* may be formed on the fourth insulating layer ILD4 from which the hard mask layer HFL is removed.

A seventh mask MSK7*b* through which seventh openings OP-M7 are defined may be disposed above the seventh photoresist layer PR7*b*. A portion of the seventh openings OP-M7 may correspond to an area in which the pixel electrode AE is formed. In the process of forming the pixel electrode AE, the second connection electrode CE2 connected to the second semiconductor pattern SP2 may be substantially simultaneously with the pixel electrode AE. Accordingly, a portion of the seventh openings OP-M7 may correspond to an area in which the second connection electrode CE2 is formed.

As the second connection electrode CE2 is simultaneously formed with the pixel electrode AE, there is no need to additionally stack a separate insulating layer or use a separate mask to form the second connection electrode CE2. Accordingly, the number of masks required to manufacture the display panel may be reduced, and the manufacturing process of the display panel may be simplified.

Figure 6L:
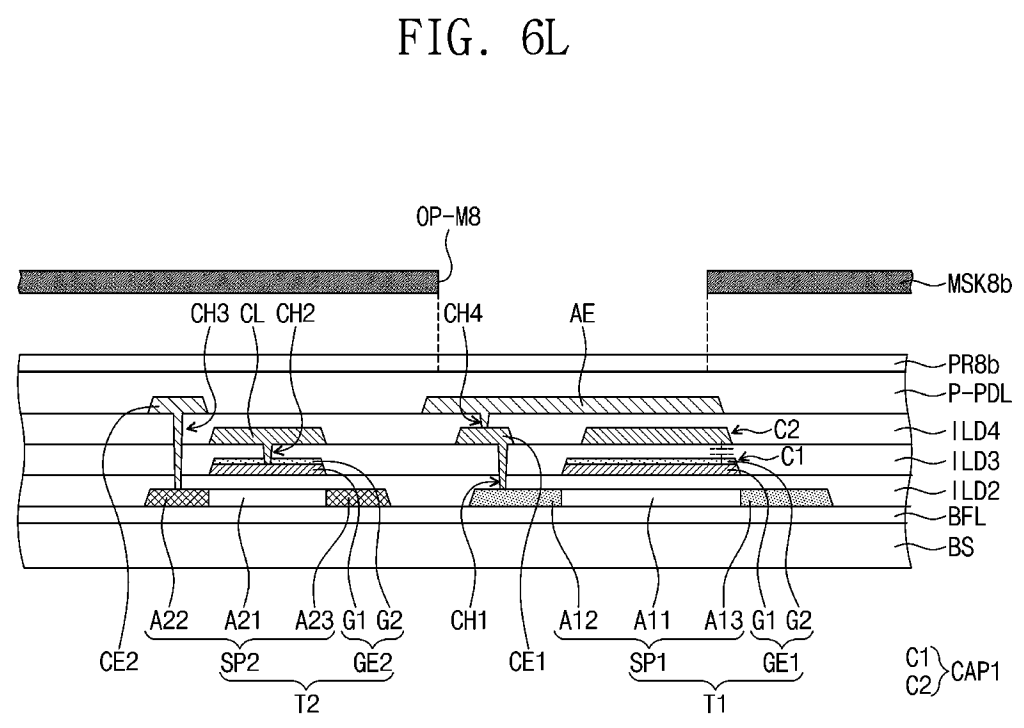
Figure 6M:
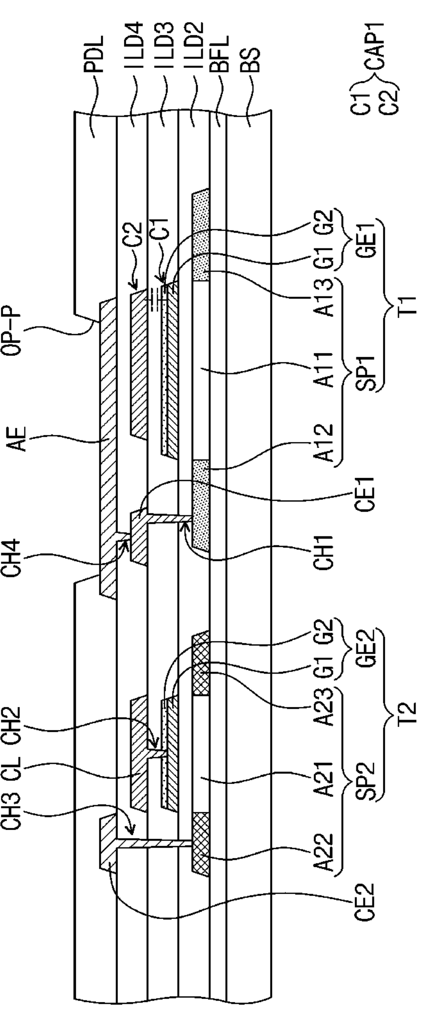

Referring to FIGS. 6L and 6M, a preliminary pixel definition layer P-PDL and an eighth photoresist layer PR8*b* may be formed on the pixel electrode AE and the fourth insulating layer ILD4 to form the pixel definition layer PDL through which the light emitting opening OP-P is formed. An eighth mask MSK8*b* through which an eighth opening OP-M8 is defined may be disposed above the eighth photoresist layer PR8*b* to pattern the preliminary pixel definition layer P-PDL. The eighth opening OP-M8 may correspond to an area in which the light emitting opening OP-P is defined. The light emitting opening OP-P may be formed through the pixel definition layer PDL through a photo process using the eighth mask MSK8*b*, and at least a portion of the pixel electrode AE may be exposed through the light emitting opening OP-P.

Although embodiments have been described, it is understood that the disclosure should not be limited to these embodiments but various changes and modifications can be made by one of ordinary skill in the art within the spirit and scope of the disclosure and as hereinafter claimed.

Therefore, the disclosed subject matter should not be limited to any single embodiment described herein, and the scope of the disclosure shall also be determined according to the attached claims.

What is claimed is:

1. A display panel comprising:

a first transistor comprising a first semiconductor pattern and a first gate electrode overlapping the first semiconductor pattern in a plan view, the first semiconductor pattern including one of a silicon semiconductor or an oxide semiconductor;

a second transistor comprising a second semiconductor pattern and a second gate electrode overlapping the second semiconductor pattern in the plan view, the second semiconductor pattern being different from the first semiconductor pattern;

a first upper electrode overlapping the first gate electrode in the plan view, the first upper electrode forming a first capacitor with the first gate electrode;

a second upper electrode forming a second capacitor with the first upper electrode;

a first connection electrode electrically connected to the first semiconductor pattern via a first contact hole through at least one insulating layer; and a light emitting element on the first connection electrode, wherein a single insulating layer is between the light emitting element and the first connection electrode, the first connection electrode is electrically connected to the light emitting element via a second contact hole through the single insulating layer, and the second gate electrode and the first upper electrode are on a same deposition layer, the second gate electrode being above the second semiconductor pattern.

2. The display panel of claim 1, wherein the first gate electrode comprises layers, and an uppermost layer among the layers comprises titanium nitride ($TiN_x$).

3. The display panel of claim 1, wherein the at least one insulating layer comprises:

a first insulating layer between the first semiconductor pattern and the first gate electrode; and a second insulating layer on the first gate electrode.

4. The display panel of claim 3, wherein the first insulating layer is between the second semiconductor pattern and the second gate electrode.

5. The display panel of claim 3, wherein the at least one insulating layer comprises a third insulating layer on the second insulating layer;

the second insulating layer is below the second semiconductor pattern; and the third insulating layer is between the second semiconductor pattern and the second gate electrode.

6. The display panel of claim 1, wherein the second gate electrode and the first gate electrode are on a same deposition layer.

7. The display panel of claim 1, wherein the second gate electrode is above the first gate electrode.

8. The display panel of claim 1, wherein the first upper electrode and the first connection electrode are on a same deposition layer.

9. The display panel of claim 1, wherein the first upper electrode and the second gate electrode are on a same deposition layer.

10. The display panel of claim 1, wherein the first upper electrode and the second semiconductor pattern are on a same deposition layer.

11. The display panel of claim 1, wherein the second upper electrode overlaps the first upper electrode in the plan view;

the first upper electrode is between the first gate electrode and the second upper electrode; and the second upper electrode and the first connection electrode are on a same deposition layer.

12. The display panel of claim 1, further comprising:

a second connection electrode electrically connected to the second semiconductor pattern through the at least one insulating layer, wherein the second connection electrode and the first connection electrode are on a same deposition layer.

13. The display panel of claim 1, further comprising:

a second connection electrode electrically connected to the second semiconductor pattern through the at least one insulating layer, wherein the second connection electrode and the light emitting element are on a same deposition layer.

14. The display panel of claim 1, further comprising:

a blocking layer on a same deposition layer as the first gate electrode, the blocking layer overlapping the second semiconductor pattern in the plan view.

15. The display panel of claim 14, wherein the second semiconductor pattern is between the blocking layer and the second gate electrode; and the blocking layer is electrically connected to the second gate electrode.

16. The display panel of claim 1, further comprising:

a first signal line on a same deposition layer as the first gate electrode, the first signal line and the first gate electrode comprising a same material; and a second signal line and the first connection electrode on a same deposition layer, the second signal line and the first connection electrode comprising a same material.

17. An electronic device comprising:

a display panel including, a first transistor comprising a silicon semiconductor pattern and a first gate electrode overlapping the silicon semiconductor pattern in a plan view, a second transistor comprising an oxide semiconductor pattern and a second gate electrode overlapping the oxide semiconductor pattern in the plan view, a connection electrode electrically connected to the silicon semiconductor pattern, a first upper electrode forming a first capacitor with the first gate electrode, a second upper electrode forming a second capacitor with the first upper electrode, a first insulating layer between the silicon semiconductor pattern and the first gate electrode, a second insulating layer between the first gate electrode and the first upper electrode, a third insulating layer between the oxide semiconductor pattern and the second upper electrode, and a fourth insulating layer between the first upper electrode and the second upper electrode, wherein the connection electrode and the second upper electrode are on a same deposition layer, and the second gate electrode and the first upper electrode are on a same deposition layer, the second gate electrode being above the oxide semiconductor pattern.

18. The electronic device of claim 17, wherein the first upper electrode and the second gate electrode are on a same deposition layer; and the third insulating layer overlaps the first upper electrode in the plan view.

19. The electronic device of claim 17, wherein the first upper electrode and the oxide semiconductor pattern are on a same deposition layer; and the third insulating layer does not overlap the first upper electrode in the plan view.

* * * * *